(12) United States Patent
Yamada et al.

(10) Patent No.: US 6,399,273 B1
(45) Date of Patent: Jun. 4, 2002

(54) WATER-PROCESSABLE PHOTORESIST COMPOSITIONS

(75) Inventors: Shintaro Yamada, Marlborough, MA (US); Timo Rager, Wuerenlingen (CH); C. Grant Willson, Austin, TX (US)

(73) Assignee: Board of Regents, University of Texas System, Austin, TX (US)

(*) Notice: Subject to any disclaimer, the term of this patent is extended or adjusted under 35 U.S.C. 154(b) by 0 days.

(21) Appl. No.: 09/639,382

(22) Filed: Aug. 14, 2000

Related U.S. Application Data

(60) Provisional application No. 60/148,836, filed on Aug. 13, 1999, and provisional application No. 60/149,622, filed on Aug. 16, 1999.

(51) Int. Cl.$^7$ .......................... G03F 7/039; G03F 7/30
(52) U.S. Cl. .................. 430/270.1; 430/326; 430/330; 430/905; 430/910; 430/919
(58) Field of Search ................ 430/270.1, 326, 430/330, 905, 910, 919

(56) References Cited

U.S. PATENT DOCUMENTS

| | | | |
|---|---|---|---|
| 5,496,678 A | 3/1996 | Imai et al. .................. 430/176 |
| 5,648,196 A | 7/1997 | Frechet et al. ........... 430/270.1 |
| 5,723,258 A | 3/1998 | Kim et al. ............... 430/270.1 |
| 5,998,092 A | 12/1999 | McCulloch et al. ..... 430/270.1 |
| 6,060,212 A | 5/2000 | McCulloch et al. ..... 430/270.1 |
| 6,190,841 B1 * | 2/2001 | Kihara et al. ............ 430/270.1 |
| 6,242,155 B1 * | 6/2001 | Yamasaki et al. ........ 430/270.1 |
| 6,265,130 B1 * | 7/2001 | Lee et al. ..................... 430/18 |

FOREIGN PATENT DOCUMENTS

WO WO 00/05282 3/2000

OTHER PUBLICATIONS

Shintaro Yamada, et al., "The design and study of water–processable positive–tone photoresists", Proceedings of the American Chemical Study, Division of Polymeric Materials: Scinece and Engineering, (1999), pp. 87–88, vol. 81.

Shintaro Yamada, et al., "The design and study of aqueous–processable positive tone photoresists", Proceedingsd of SPIE, Advances in Resist Technology and Processing XVII, (2000), pp/ 5569–578, vol. 3999, Part One of Two Parts.

* cited by examiner

*Primary Examiner*—John S. Chu
(74) *Attorney, Agent, or Firm*—Townsend and Townsend and Crew LLP

(57) ABSTRACT

Water-processable positive-tone photoresists comprising a water-soluble polymer, wherein the polymer contains a heat-labile functional group that renders the polymer insoluble in water or an aqueous base upon heat treatment, and an acid-labile functional group that restores said water or aqueous base solubility to the polymer upon irradiation in the presence of a water-processable photoacid generator, are described. Also described are the methods of making such polymers and photoresists.

32 Claims, 8 Drawing Sheets

WATER-PROCESSABLE PHOTORESIST COMPOSITIONS

CROSS-REFERENCES TO RELATED APPLICATIONS

This Application claims priority from United States Provisional Application No. 60/148,836, filed Aug. 13, 1999, and from United States Provisional Application No., 60/149, 622, filed Aug. 16, 1999; both applications are hereby incorporated by reference and made a part of this Application.

FIELD OF THE INVENTION

The present invention relates to water processable photoresist compositions, their uses and methods to prepare such photoresist compositions.

BACKGROUND OF THE INVENTION

Photoresists are compositions that are capable of transferring an image onto a substrate, such as a printed circuit board, silicon wafer, or a lithographic plate. After a layer of a photoresist is deposited on a surface as a thin film, the film is selectively exposed, typically through a photomask, to a source of activating radiation, such as ultraviolet light or an electron beam. The photomask has areas that are opaque and other areas that are transparent to the activating energy. The pattern on the photomask formed by opaque and transparent areas defines the pattern, such as a circuit, to be transferred to the substrate.

Once the substrate has been exposed selectively to activating radiation in the desired pattern, the film layer must be modified, or developed. Development of the image transferred to the substrate requires the selective removal of the photoresist in accordance with the pattern. Photoresists can be characterized as positive active or negative active, alternatively referred to as producing a positive tone or negative tone, respectively. Exposed portions of a negative-active photoresist become less soluble in a developing solution than unexposed areas as the result of a photochemical reaction. This difference in solubility allows for the selective removal of the photoresist in the unexposed areas and the transfer of the photomask image to the substrate. In the case of positive-acting photoresists, exposure to activating radiation will cause the coating to become more soluble in a developing solution than the unexposed areas. The imaged photoresist may act as a protective coating for subtractively etching a metal substrate, known as print-and-etch, or allow the exposed bare metal surface to be further built up in thickness by electroplating methods, known as print-and-plate. The resist may then be selectively stripped. For print-and-etch processes, the exposed metal on the substrate may be etched to form the desired pattern or circuit on the substrate surface.

Photoresist compositions include a photoacid generator (PAG), which is selectively activated by exposure to the activating radiation to produce an acid-catalyzed transformation in the resist film in the regions transparent to the photomask. Sensitizers and other components also may be employed to optimize the properties of a given photoresist.

The photoresists used by the semiconductor industry are typically cast from organic solvents, and in many cases, require organic solvents or cosolvents as developing solutions. Organic solvents present a number of disadvantages, including the potential for unintended release to the environment, operator safety hazards, and negative economic impacts. Thus there is a present need to develop water-processable photoresist compositions. The present invention fulfills this and other needs.

SUMMARY OF THE INVENTION

The present invention relates to photoresists that can be cast from and developed with aqueous media, precluding the need for significant use of organic solvents. The water-processable, positive-tone photoresist compositions of the present invention comprise a water-processable photoacid generator, water, and a water-soluble polymer, said polymer containing a heat-labile functional group that, when activated by heat, renders said polymer insoluble in water or aqueous base; and said polymer also contains an acid-labile functional group that, when activated by acid produced by action of the photoacid generator, renders said heat-treated polymer soluble in water or aqueous base.

The present invention also includes a water-processable positive-tone photoresist composition comprising:
 (a) a polymer comprising at least one salt of a carboxylic acid and at least one acid labile group and wherein said polymer undergoes decarboxylation upon heat treatment and wherein said polymer undergoes cleavage upon acid treatment;
 (b) a water-soluble photoacid generator; and
 (c) water or an aqueous base;
 the composition being characterized in that a dry film of the composition can be prepared; wherein the film is soluble in water or an aqueous base prior to the heat treatment, and insoluble in water or aqueous base after the heat treatment of said polymer; and wherein exposure of said film to radiation renders said film soluble in water or said aqueous base.

Further provided are met hods for producing positive-tone photoresist compositions comprising the steps of:
 (a) applying to a substrate a solution comprising a water-soluble polymer capable of being converted to a water-insoluble form of the polymer upon heating and capable of being restored to a water-soluble form of the polymer upon irradiation, wherein the polymer contains a heat-labile functional group and an acid-labile functional group; a water-processable photoacid generator; and water or an aqueous base; to produce a coated substrate;
 b) heating the coated substrate to remove the water from said substrate to form a film on the substrate, and to convert the water-soluble polymer to a water-insoluble form of polymer;
 (c) selectively exposing said film to irradiation to generate acid from the water-processable photoacid generator, such that the generated acid restores the water-insoluble polymer to a water-soluble form of the polymer; and
 (d) developing the exposed from with an aqueous developer to produce the positive-tone photoresist.

Also provided by the present invention are water-processable positive-tone photoresist compositions made by the methods or processes described.

DESCRIPTION OF THE SPECIFIC EMBODIMENTS

Figure 1:
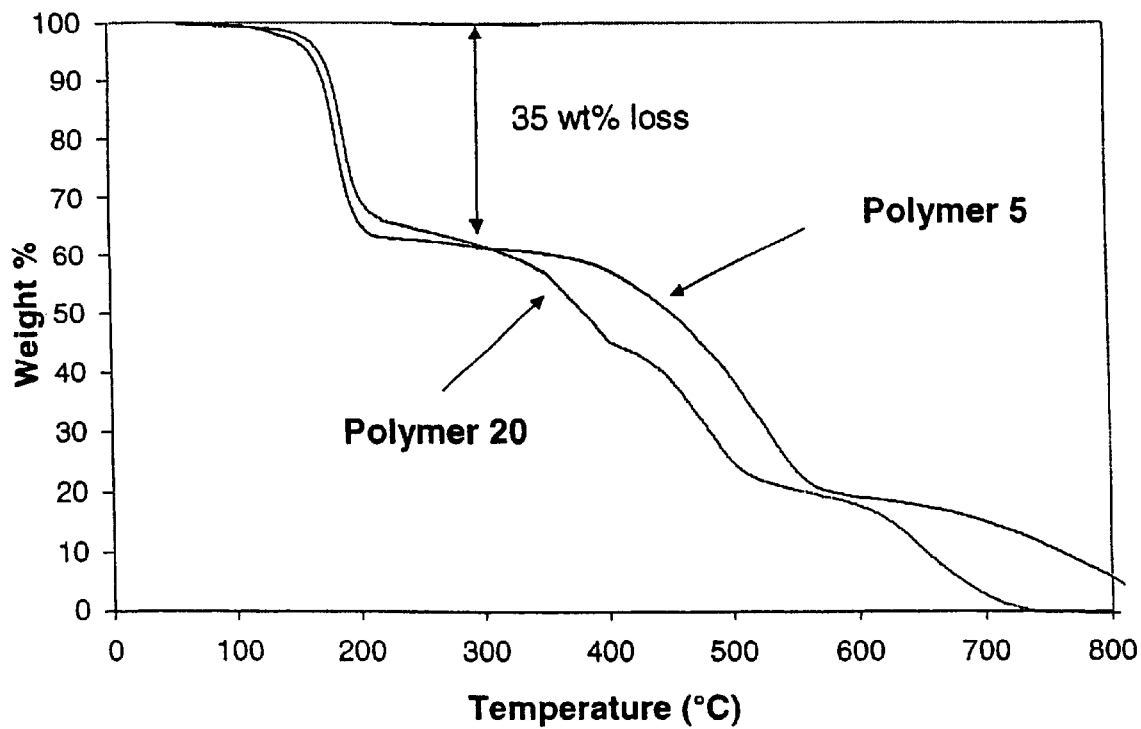
FIG. 1 shows the Thermal Gravimetric Analysis (TGA) of polymers 5 and 20.

The compositions of the present invention are positive tone photoresist compositions that can be used to transfer patterns to printed circuit boards, silicon wafers, lithography plates, magnetic disks, substrates for flex circuitry, and the like, using aqueous media for casting and development. The design of an aqueous positive-tone resist requires the incorporation of two solubility switches: the water-soluble formulation must first be rendered insoluble by the casting process; however, there must be a means to render the film soluble again on the basis of some photochemical process during exposure of the film to radiation. This process is illustrated in Scheme 1:

Scheme 1

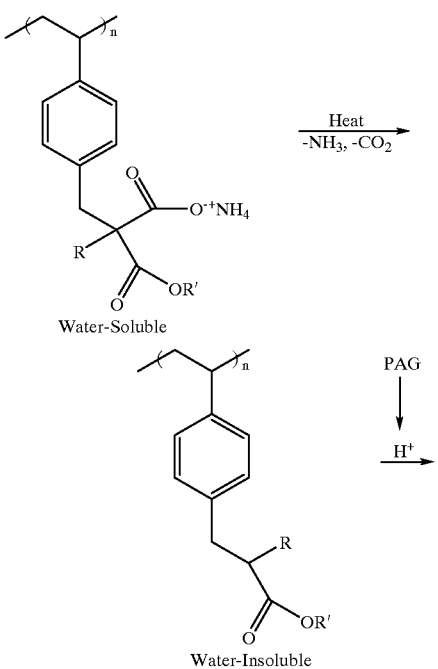

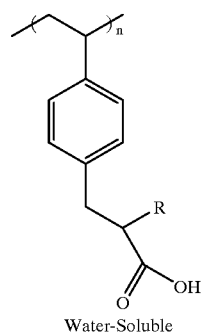

R = H or CH₃
R' = Acid-Labile Protecting Group

The present water-processable resist compositions are able to meet the requirement of the two solubility switches, as well as meeting other requirements for useful photoresists. The compositions of the present invention comprise a water-soluble polymer, water-processable photoacid generator, and water or aqueous casting solvents and developing solutions; or the water-soluble polymer with or without the photoacid generator or water.

The Polymer

The polymers of the present invention can be homopolymers or copolymers of two or more monomers. The monomers may include, without limitation, styrenes, acrylates, methacrylates, methylidenemalonates, and norbornenes, as well as their analogs. In the case of copolymers, there are no intrinsic limitations with respect to the ratio of monomers. The photoresists are applied to substrates to form a film after suitable drying; therefore, physical properties, such as the flexibility and thermal and chemical stability of the film, would be considered in choosing an appropriate polymer backbone system.

Selection of the pendant functional groups of the polymer or copolymer is accomplished to arrive at a polymer wherein: (a) the initial form of the polymer is soluble in water or aqueous base; (b) it undergoes a chemical transformation upon heating to a form that renders the resulting polymer insoluble in water, aqueous base, and other aqueous photoresist developing solutions; and (c) it subsequently undergoes a second chemical transformation upon localized exposure to acid that renders the resulting form of the polymer soluble in water, aqueous base, or other aqueous photoresist developing solution.

In one embodiment of the present invention, the pendant groups of the polymer or copolymer contain at least one carboxylic acid group as the free acid or as a salt, and at least one carboxylic acid with an acid-labile protecting group. The free carboxylic acids or salts are capable of undergoing decarboxylation under thermal treatment. The carboxylic acids include alpha-cyano, alpha carboxyl, or beta-carbonyl acids. Suitable examples of alpha-cyano carboxylic acids include cyanoacetic acid, alpha-cyanoacrylates, and the like. Alpha-carboxyl acids include malonic acid, 2-methyl malonic acids, Meldrum's Acid, Methyl Meldrum's Acid, malonic acid half-esters, and the like, whereas beta-carbonyl acids include acetoacetic acid, 3-ketoglutaric acid, and the like.

The salt of the carboxylic acid groups can be any salt conferring water or aqueous base solubility to the polymer. This includes ammonium or alkylammonium salts of carboxylic acids as well the alkali and alkaline earth metal salts of carboxylic acids, of which low molecular weight ammonium salts such as ammonium, methylammonium, triethylammonium, and the like are especially preferred due to their volatility during the heat treatment of the decarboxylation step.

The acid-labile protecting group on the polymer may be any group that cleaves in the presence of a photoacid generator and upon application of radiation. Suitable examples of acid-labile protecting groups include, without limitation, ester groups of the formula—C(O)OR$_1$ (I), where R$_1$ is an alkyl, aryl, or substituted alkyl or aryl group; alkyl (e.g., tert-butyl) carbonates of phenols; acetals, and ketals. In one preferred embodiment, the acid labile protecting group is the tert-butoxy carbonyl group represented by the formula —C(O)OC(CH$_3$)$_3$, i.e., where R$_1$ is —(CH$_3$)$_3$. In another preferred embodiment, R$_1$ is an isobornyl group represented by the formula (II)

(II)

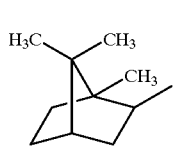

or a tetrahydropyranyl group; or a tetrahydrofuranyl group

Other acid cleavable groups known in the art include the imide groups represented by the formula (III):

(III)

which can be blocked with certain groups, X, to form compounds represented by the formula (IV)

(IV)

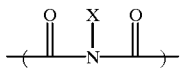

These X groups can be cleaved by acid to regenerate the unblocked imide. Methods for formation of polymers having tert-butyl esters of carboxylic acids and tert-butyl carbonates of hydroxyl groups are disclosed in U.S. Pat. No. 4,491,628.

In one embodiment, a homopolymer containing both an acid-labile group and a beta-carbonyl acid is prepared. Schemes 2 and 3 illustrate two alternate routes to the synthesis of poly(mono tert-butyl-2-(4-vinylbenzyl) malonate 5. Scheme 2 utilizes benzyl tert-butyl malonate as starting material and generates the free carboxylic acid group required for water solubility and decarboxylation after polymer formation, whereas Scheme 3 utilizes Meldrum's Acid 7 as the malonate derivative and forms the polymer as the final step of the synthesis.

Scheme 2

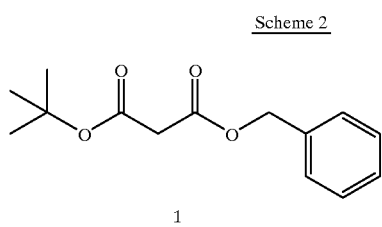

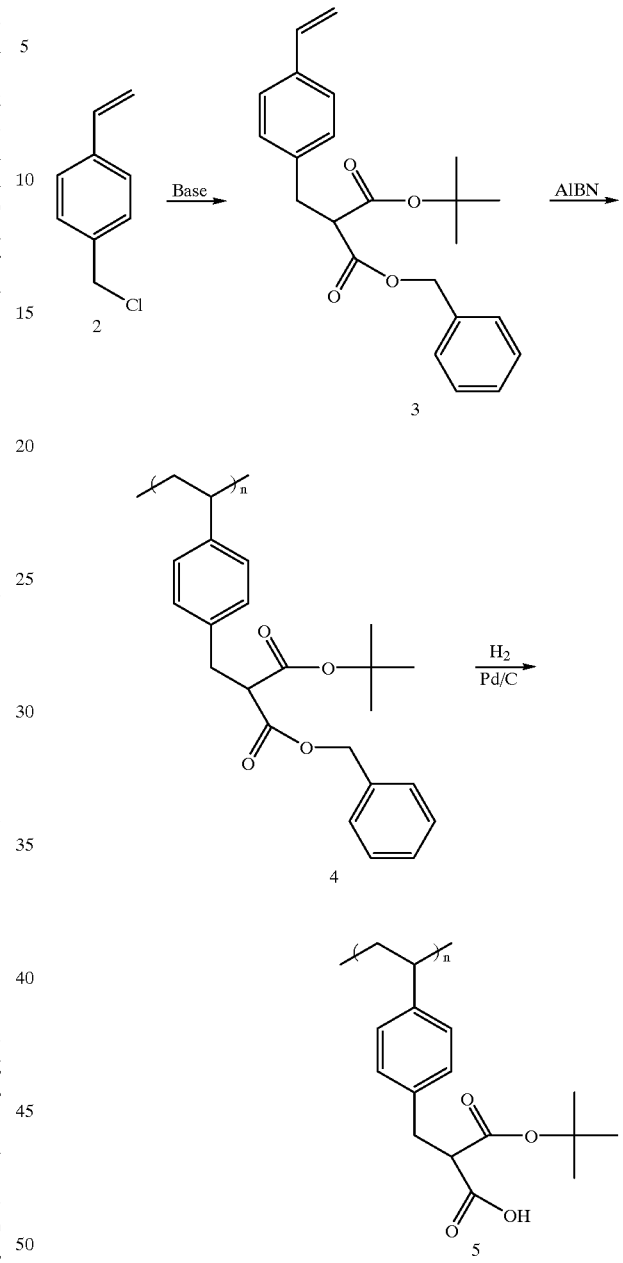

Scheme 3

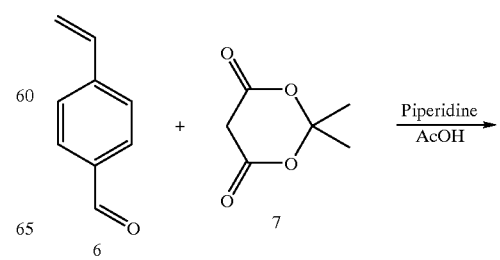

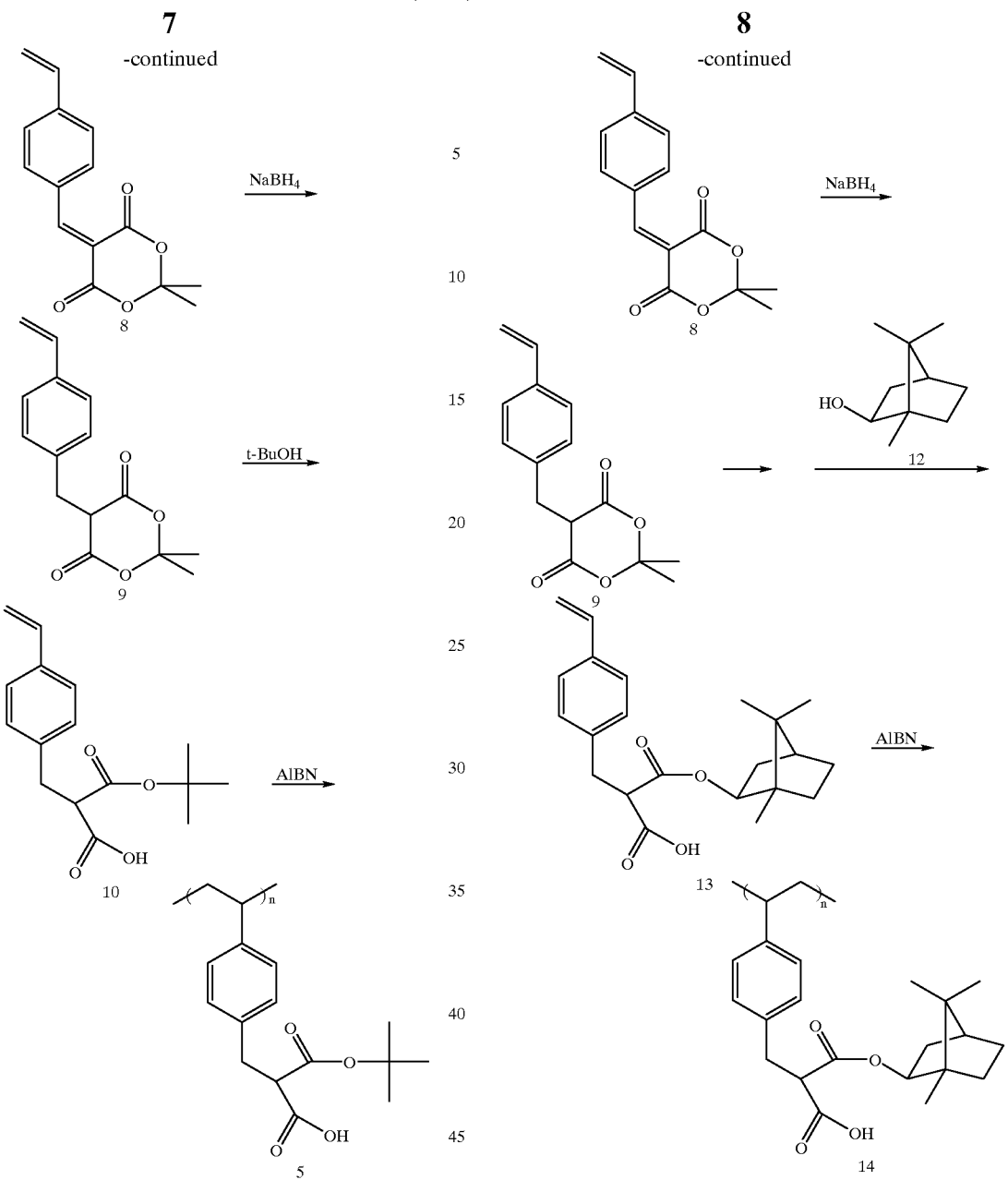

The general approach outlined in Scheme 3 has also been exemplified in the synthesis of poly(mono-isobornyl 2-(4-vinylbenzyl)malonate) 14 as shown in Scheme 4.

Scheme 4

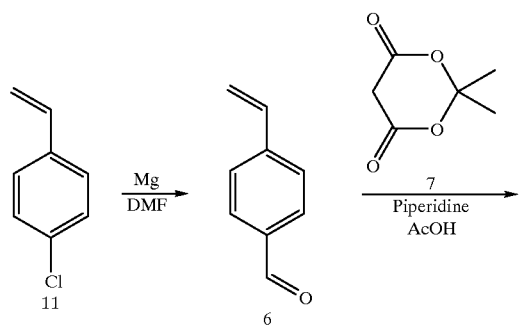

In one embodiment, the polymer of the present invention is poly(mono tert-butyl-2-methyl-2-(4-vinylbenzyl)malonate) 20. The synthesis of poly(mono tert-butyl-2-methyl-2-(4-vinylbenzyl)malonate) 20 starting from Methyl Meldrum's Acid is illustrated in Scheme 5 below, and an alternate route is described in Scheme 6.

Scheme 5

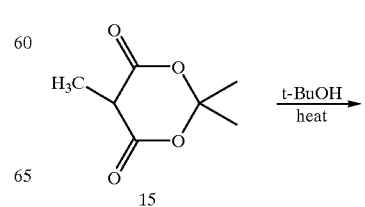

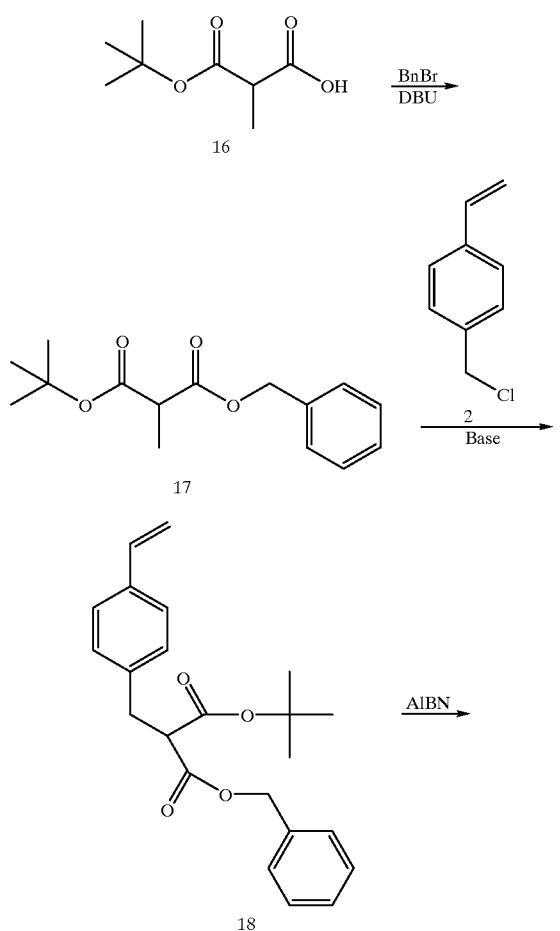
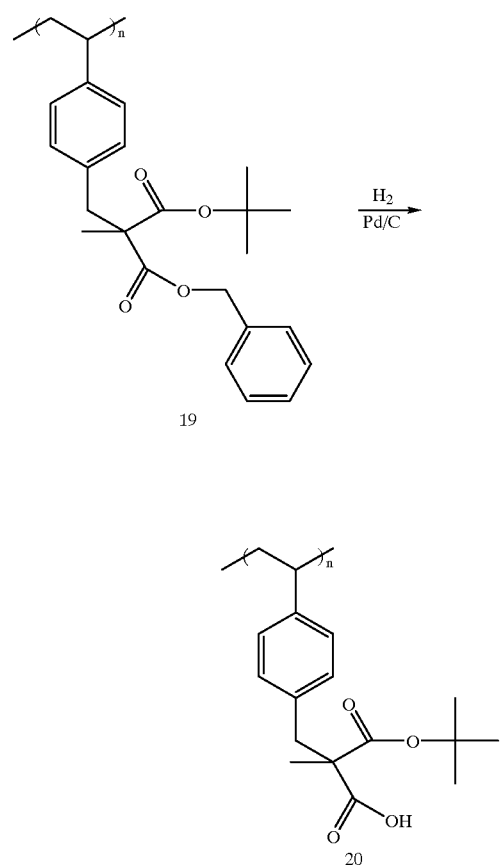

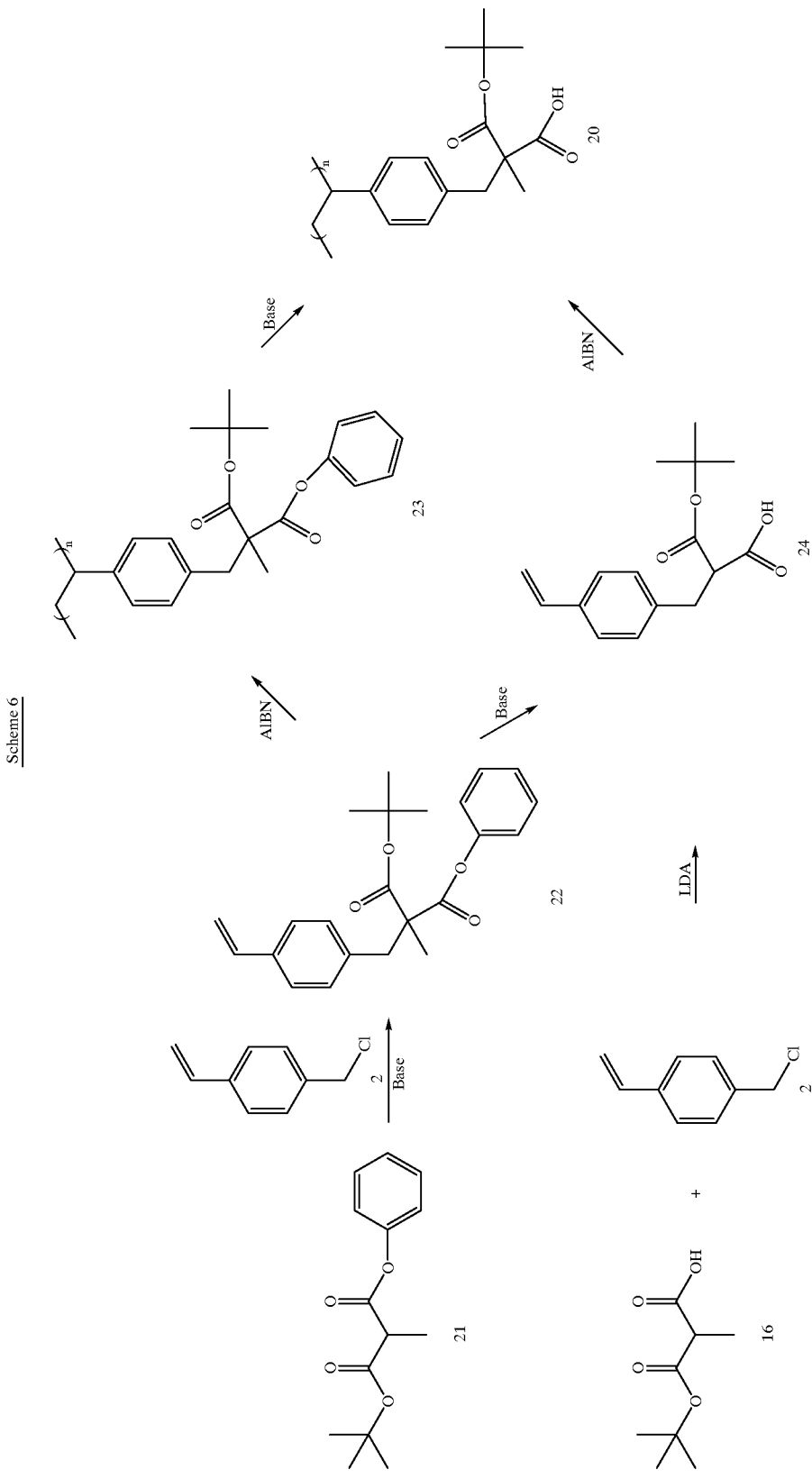
Scheme 6

In one embodiment, the copolymer of this invention is poly(mono(4-vinylbenzyl)malonate-co-tert-butyl acrylate) 28. The synthetic scheme for the preparation of this styrene-acrylate copolymer is shown in Scheme 7 below.

Scheme 7

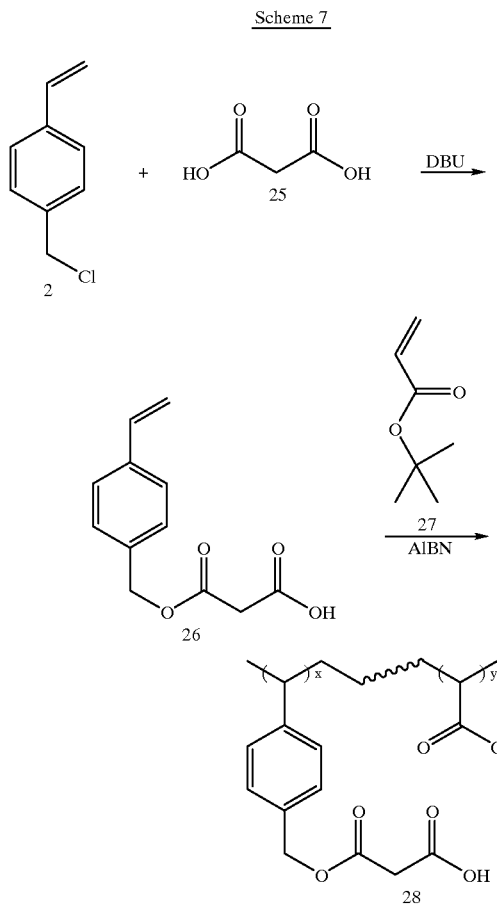

The salt formation (with ammonia) and decarboxylation reactions are exemplified in Scheme 8 below:

Scheme 8

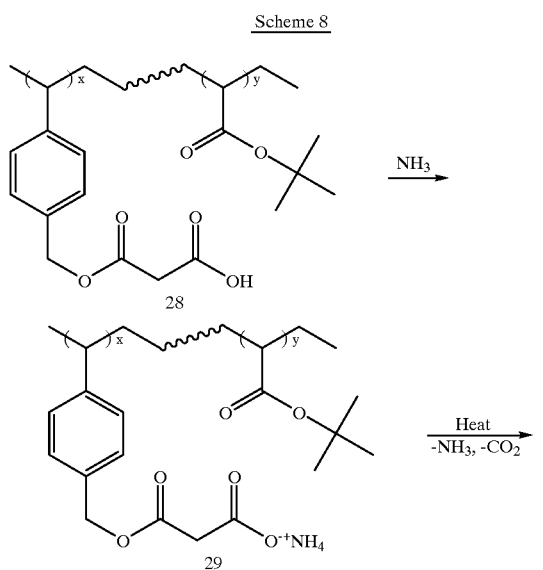

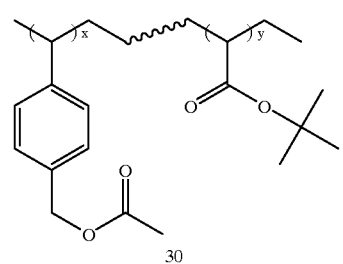

In one embodiment, the polymer of the present invention is poly(mono tert-butyl-2-(4-vinylbenzyl)malonate-co-(4-hydroxystyrene)) 33. The poly(mono tert-butyl-2-(4-vinylbenzyl)malonate-co-(4-hydroxystyrene)) 33 can be made by the copolymerization of mono tert-butyl-2-(4-vinylbenzyl)malonate 10 and 4-acetoxystyrene 31 via free radical polymerization, followed by hydrolysis of acetoxy group with a base. This is shown in Scheme 9.

Scheme 9

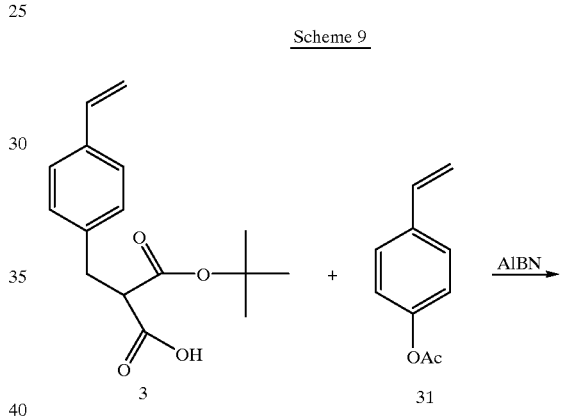

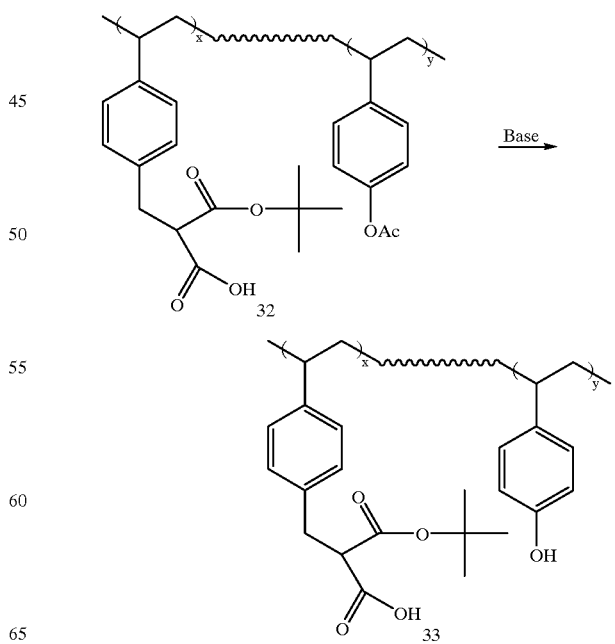

In another embodiment, the polymer is the copolymer poly(mono(4-vinylbenzyl)malonate-co-tert-butyl-4-vinylphenylacetate)) 36. The copolymer poly(mono(4-vinylbenzyl)malonate-co-tert-butyl-4-vinylphenylacetate)) 36 can be made by the free radical copolymerization of mono-4-benzyl malonate 26 and tert-butyl-4-vinylphenylacetate 35, the latter of which can be made from 4-chloromethylstyrene 2 through the Grignard reaction followed by esterification with tert-butanol, as shown in Scheme 10 below:

Scheme 10

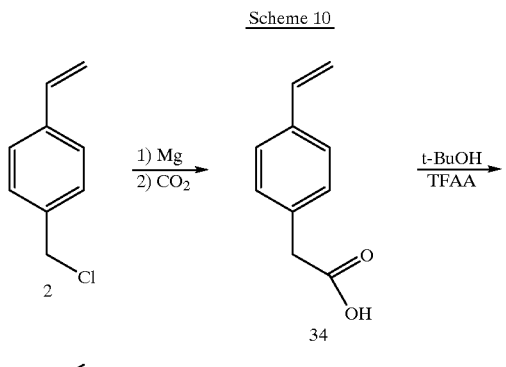

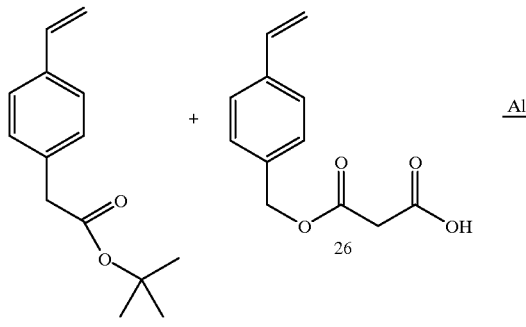

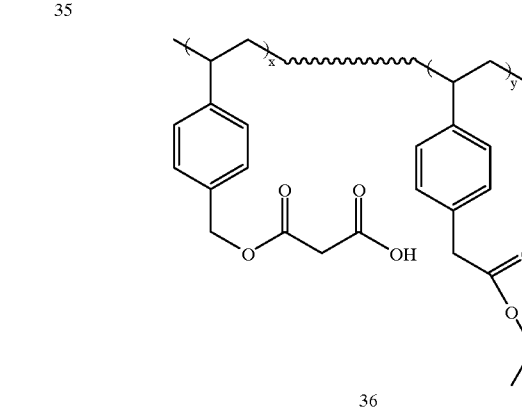

In one embodiment, the polymer is the terpolymer poly-(mono 4-vinylbenzyl malonate-co-4-acetoxystyrene-co-tert-butyl-4-vinylphenylacetate) 37. The terpolymer can be prepared by the free radical terpolymerization of each of the three respective monomers: mono 4-vinylbenzyl malonate 26, 4-acetoxystyrene 31 and tert-butyl-4-vinylphenylacetate 35. Base hydrolysis of the resulting terpolymer 36 with ammonium hydroxide results in hydrolysis of the acetoxy group to a hydroxyl group, resulting in the formation of the terpolymer poly(mono 4-vinylbenzyl malonate-co-4-hydroxystyrene-co-tert-butyl-4-vinylphenylacetate) 37. This is shown in Scheme 11.

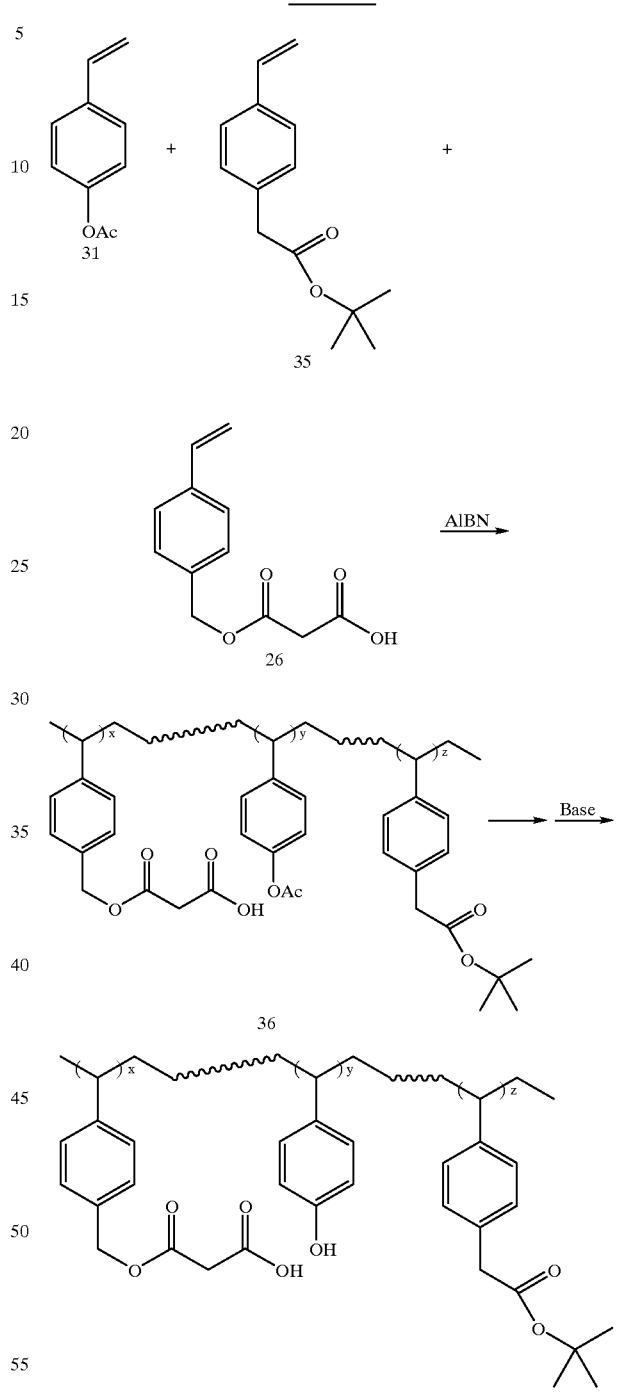

The phrase "soluble in water or aqueous base" as used herein refers to chemical compositions which are soluble in water in aqueous base to the extent of at least one gram per liter of water at 25° C. Analogously, the phrase "insoluble in water or aqueous base" refers to chemical compositions which do not go into solution in water or aqueous base when at least one gram of the composition is attempted to be dissolved in one liter of water at 25° C.

The carboxylic acid salt functionality and the acid-labile groups of the inventive polymers are preferably positioned as pendant groups from the polymer backbone. The polymers are characterized in that they undergo thermal decarboxylation upon heating at a temperature sufficiently high to cause said decarboxylation. The temperature of decarboxylation ranges from 60° C. to about 190° C., preferably from 100° C. to 170° C., and more preferably from 110° C. to 140° C. The polymers also have the characteristics that they are normally soluble in water or aqueous base prior to decarboxylation but insoluble in water or aqueous base upon decarboxylation.

Water-Soluble Photoacid Generators

The water-processable photoacid generators (PAG) include those that function in a water-soluble environment or can be developed in a water-soluble environment and generate acid upon exposure to irradiation. Preferred photoacid generators include, but are not limited to, aryl diazonium, aryl sulfonium, aryl iodonium, imidosulfonate, diaryliodonium, trialkylsulfonium, and triarylsulfonium salts. Various anions can be employed as counter ions, and include, but are not limited to, tetrafluoroborate, hexafluoroantimonate, hexafluoroarsenate, hexafluorophosphate, and triflate. Diazo ketones and esters of polyhydroxyaromatics and salts also may be employed.

The photoacid generator can be present in any amount sufficient to cleave the acid-labile group of the polymer to generate an acid functionality upon irradiation and, optionally, heating. The amount of photoacid generator utilized is typically from about 1 to about 50% w/w of the polymer, more preferably from about 0.5% to about 15.0% w/w. (See High Perform. Polym., 7:503–515 (1995).

The Water Processable Photoresist Composition

The water processable photoresist composition of the present invention typically comprises water, the polymer and the water-soluble photoacid generator (PAG). In one embodiment, the polymer is present at a level of 5% to 30% by weight of the total composition, and in one embodiment from 10 to 25% by weight of the total composition.

The water processable photoresist compositions of the present invention can be used to cast films of the composition. The dry film has the characteristic that it is soluble in water or the aqueous base of the present invention prior to decarboxylation of the polymer, is insoluble in water or aqueous base upon decarboxylation of the polymer, but upon exposure of the film to radiation followed by heating at the temperature of cleavage of the acid-labile protecting groups, it is rendered soluble in water or the aqueous base. The acid from the photoacid generator is able to cleave the acid-labile group in the polymer and to generate an acid functionality at that site.

Photoresist Method

In one embodiment, the compositions of the present invention are used for coating a substrate to produce a positive-tone photoresist comprising the steps of:

(a) applying to a substrate a solution comprising a water-soluble polymer capable of being converted to a water-insoluble form of the polymer upon heating and capable of being restored to a water-soluble form of the polymer upon irradiation, wherein the polymer contains a heat-labile functional group and an acid-labile functional group; a water-processable photoacid generator; and water or an aqueous base, to produce a coated substrate;

(b) heating the coated substrate to remove the water from said substrate to form a film on the substrate, and to convert the water-soluble polymer to a water-insoluble form of polymer;

(c) selectively exposing said film to irradiation to generate acid from the water-processable photoacid generator, such that the generated acid restores the water-insoluble polymer to a water-soluble form of the polymer; and (d) developing the exposed film with an aqueous developer to produce the positive-tone photoresist.

A solution of the composition is coated on a substrate to form a coating and the coating formed is heated or prebaked to remove the aqueous solvent and form the desired resist film. To coat the composition on the substrate, a process such as dipping, spin coating, roll coating, screen printing, or applicator coating may be employed. The layer thickness is typically in the range from about 0.1 to about 10 μm, preferably from about 0.5 to about 2.0 μm. (The polymer and PAG can be applied to the substrate simultaneously or sequentially in either order.)

Preactivation baking conditions may differ depending upon the types of the components in the composition, their proportion and the desired coating layer thickness. Usually prebaking is from about 60° C. to about 190° C., preferably from about 100° C. to about 170° C., and more preferably from about 110° C. to about 140° C., for about one to about 60 minutes, preferably from about two to ten minutes.

The formed resist film is typically exposed to ultraviolet radiation or visible light radiation of about 150 nm to about 600 nm in wavelength, preferably about 157 nm to 365 nm, more preferably 193 nm or 248 nm, through a mask with a given pattern, to expose the resist film. Irradiation sources include low-pressure mercury lamps, high-pressure mercury lamps, preferably excimer lasers, ultrahigh-pressure mercury lamps, metal halide lamps, argon gas lamps, and the like. The radiation to which the resist film is exposed include ultraviolet rays, visible light rays, far ultraviolet rays, X-rays, electron beams, and the like.

The process parameters such as exposure time and distance from the radiation source and radiation-sensitive layer will depend on the type of radiation-sensitive formulation and on the properties of the coating and the pattern to be transferred. The compositions can be made sensitive to certain wavelengths by using sensitizers that absorb at the activation wavelength. Examples of sensitizers include, without limitation, polycyclic aromatic compounds such as pyrene and perylene. Other dyes are also available that are operative sensitizers, including the acridines. Other specific examples of sensitizers include benzophenone, p,p'-tetramethyldiaminobenzophenone, p,p'-tetraethylethylaminobenzophenone, 2-chlorothioxanthone, anthrone, 9-ethoxyanthracene, anthracene, phenothiazine, benzil, Acridine Orange, benzoflavin, Cetoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin) and coronene.

After exposing the resist film to radiation, the substrate is typically heated from about 60° C. to about 200° C., preferably from about 100° C. to about 170° C. for a period of time that is typically from about 0.1 minutes to about 30 minutes, preferably from about 0.5 minutes to about 10 minutes. The positive-tone pattern is developed by dissolving and removing the exposed unnecessary areas, using a water or an aqueous base solution as the developing solution. The aqueous bases include alkaline and alkaline earth metal hydroxides, such as sodium and potassium hydroxide, and ammonium hydroxide and N-tetraalkylammonium hydroxides. Other suitable examples of aqueous base include sodium carbonate, sodium silicate, sodium metasilicate, ethylamine, n-propylamine, diethylamine, di-n-propylamine, triethylamine, methyldiethylamine, dimethylethanolamine, triethanolamine, tetramethylammonium hydroxide, tetratetraethylammonium hydroxide, pyrrole, piperidine, 1,8-diazabicyclo[5.4.0]-7-undecene and 1,5-diazabicyclo[4.3.0]-5-nonane.

Development time differs depending upon the types of the respective components of the composition, their mixing proportions, and the dried coating thickness of the composition. Usually the development may be carried out for about 1 to about 30 minutes, and may be carried out by any of dip development, paddle development, spin coat development, and/or spray development. After development, the composition is rinsed with water for about 30 to about 90 seconds, followed by air drying, such as by an oven or an air gun.

The photoresist compositions may be etched via wet or dry etching processes, although dry etching processes are preferred. Dry etching includes processes such as plasma etching and reactive ion etching, with the most aggressive etching processes employing chlorine or chlorine in combination with other components, such as hydrogen bromide and the like.

In the compositions of the present invention, various additives may be included during processing. For example, a surface-active agent may be optionally added in order to improve the coating properties, anti-foaming properties and leveling properties. Also, an adhesive auxiliary may be used in order to improve the adhesion to the substrate. In the compositions of the present invention, a filler, a colorant, and/or a plasticizer may be included.

A general discussion of photoresists and their properties is found in Jones, R. "Resists in Electron-beam Lithography" TRIP, 1(12):372–380 (December 1993).

EXAMPLES

For characterization of the various compounds below, various instrumental techniques such as nuclear magnetic resonance (NMR) spectroscopy, infrared spectroscopy (IR), and mass spectrometry (MS) are used. For characterization by proton NMR, the following symbols are used: s=singlet; d=doublet; triplet; q=quartet; J=coupling constant. For IR, the following symbols are used: s=strong, bw=broad/weak, w=weak; m=medium.

The molecular weights of various polymers were measured by gel permeation chromatography (GPC), using polystyrenes as standards, provides both weight average and number average molecular weights as well as the entire molecular weight distribution of the polymers. Both number average molecular weight (Mn) and weight average molecular weight (Mw) can be measured by this technique. The polydispersity index (PDI) is the quotient of Mw/Mn.

Example

Synthesis of poly(mono-tert-butyl-2-(4-vinylbenzyl) malonate) 5
Benzyl-tert-butyl-2-(4-vinylbenzyl)malonate 3
Method 1

Benzyl-tert-butyl malonate 1( 5.0 g, 19.98 mmol) was dissolved in 10 ml of benzene. DBU (3.04 g, 19.98 mmol) and 4-vinylbenzylchloride 2 (3.05 g, 19.98 mmol) were added to the solution. The mixture was allowed to stir at room temperature for three days. Additional DBU (1.0 g) was added, and the solution was stirred at 50° C. for 3 days. The mixture was washed with diluted hydrochloric acid, 5 wt % $Na_2CO_3$, deionized water, and dried over anhydrous $MgSO_4$. After removal of the drying agent, the filtrate was concentrated in vacuo, and purified by a column chromatography. Column chromatography (silica gel, eluent; hexanes/ethyl acetate=1/9 by volume) was performed to separate the product (Rf=0.64 on TLC with hexanes/ethyl acetate=8/2 by volume). The product (1.50 g) was separated as a clear liquid in 21% yield.

$^1$H-NMR ($CDCl_3$, ppm): δ1.33 (s, 9H, t-Bu), 3.16 (d, 2H, J=7.9 Hz, $CCH_2Ph$), 3.61 (t, 1H, J=7.9 Hz, H(C2)), 5.11 (d, 2H, J=5.4 Hz, $OCH_2Ph$), 5.18 (d, 1H, J=10.9 Hz, CH=$CH_2$, cis), 5.67 (d, 1H, J=17.6 Hz, CH=$CH_2$, trans), 6.66 (q, 1H, J=10.9, 17.6 Hz, $CH$=$CH_2$), 7.29 (m, 9H, Ar—H)

MS (CI+) m/z=367 (100 [M+H]$^+$), 311 (99 [M+H—$C_4H_8$]$^+$).

Method 2

Potassium tert-butoxide (2.24 g, 19.98 mmol) was placed in a 100 ml flask attached with a drying tube containing $CaCl_2$. Tert-butanol (50 ml; distilled over $CaH_2$) was added to the flask, and the mixture was stirred until a clear solution was obtained. Benzyl-tert-butyl malonate (5.00 g, 19.98 mmol) was slowly added to the solution. Upon addition of the malonate, the solution solidified. The solid was heated at 60° C. giving a clear solution. Thereafter, 4-Vinylbenzylchloride (3.05 g, 19.98 mmol) was added slowly at 60° C. producing a yellow precipitate. The mixture was allowed to stir at 60° C. for two days. Ethylether (100 ml) was added to the mixture, and washed with dilute aqueous HCl. The organic layer was washed with water until neutral, and then dried over anhydrous $MgSO_4$. The drying agent was removed by gravity filtration, and the filtrate was concentrated giving a slightly yellow liquid. Many spots were observed on a TLC plate, indicating the product to be a mixture of several components.

Synthesis of Poly(benzyl-tert-butyl-2-(4-vinylbenzyl) malonate)4

Benzyl-tert-butyl-(4-vinylbenzyl)malonate 3 (1.00 g, 2.729 mmol), and AIBN (0.0224 g, 0.1364 mmol) were dissolved in 5 mL of freshly distilled THF under $N_2$. Dry nitrogen was bubbled through the solution for five minutes. The solution was heated with stirring at 60° C. for 17 h. The resulting mixture was cooled and the polymer was precipitated into 150 mL of methanol with rapid stirring. The obtained polymer was dried in vacuo at room temperature overnight giving 0.75 g of white solid in 75% yield.

$^1$H-NMR (ppm, Acetone-$d_6$): 1.4~2.0 (bm, 12H, t-Bu, $CH_2$), 3.1 (bs, 2H, $CCH_2Ph$), 3.6 (bs, 1H, H(C2)), 5.2 (bd, 2H, $OCH_2Ph$), 6.5 (bs, 2H, Ar—H), 7.0 (bs, 2H, Ar—H), 7.3 (bs, 5H, $OCH_2Ph$)

GPC: Mn=12600, Mw=23700, PDI=1.88
p-Vinylbenzaldehyde 6

Magnesium turnings (17.26 g, 710 mmol, EM Science) were added to a three neck flask with a reflux condenser and an addition funnel and the entire apparatus was dried under vacuum. After cooling down to room temperature, the equipment was purged with nitrogen. A solution of p-chlorostyrene 11 (90 g, 649.4 mmol, Aldrich) in THF (433 mL, dried over Na/K and distilled) was added to the addition funnel. A small amount of this solution and a crystal of iodine and pure p-chlorostyrene (6.0 g, 43.3 mmol) were added to the magnesium and the reaction was initiated by warming the mixture with a heat gun. After the reaction had started, the rest of the p-chlorostyrene solution was added dropwise. The reaction mixture was heated under reflux for 1 h and then cooled down with ice. A solution of DMF (50.64 g, 693 mmol, dried over CaSO$_4$ and distilled) in dry THF (173 mL) was added dropwise. The mixture was stirred for 2 h and then allowed to stand overnight. The product was hydrolyzed with saturated NH$_4$Cl solution (800 mL), the organic layer was separated and the aqueous phase extracted three times with ether. The combined ether extracts were dried over MgSO$_4$ and concentrated. Vacuum distillation (58° C., 1.2 mmHg) in the presence of 4-tert-butylcatechol yielded 48.5 g (53%) of a colorless oil.

$^1$H NMR (300 MHz, CDCl$_3$, δ(ppm, TMS)): 5.43 (d, $^3$J=11.0 Hz, 1H, =CH$_{trans}$); 5.91 (d, $^3$J=17.5 Hz, 1H, =CH$_{cis}$); 6.76 (dd, $^3$J=11.0 Hz, $^3$J=17.5 Hz, 1H, =CH$_{gem}$); 7.54, 7.83 (2 m, 4H, CH$_{arom}$); 9.98 (s, 1H, CHO).

$^{13}$C NMR (77.5 MHz, CDCl$_3$, δ(ppm), APT): 117.4 (=CH$_2$), 126.6 (C(3), C(5)), 130.0 (C(2), C(6)), 135.6 (C(1)), 135.8 (=CH), 143.3 (C(4)), 191.6 (C=O).

FT-IR (film, cm$^{-1}$): 3090 w, 3010 w, 2825 m, 2735 m, 1705 s, 1605 s, 1390 m, 1310 m, 1215 m, 1165 m, 990 m, 920 m, 840 m, 745 m.

CI-MS (CH$_4$, m/z): 133 (100, [M+H]$^+$).

2,2-Dimethyl-5-(4-vinylbenzyl)-1,3-dioxane-4,6-dione 8

Vinylbenzaldehyde 6 (14.3 g, 108 mmol) and Meldrum's Acid 7 (15.6 g, 108 mmol) were dissolved in benzene (100 mL) and piperidine (0.65 mL, 6.5 mmol) and glacial acetic acid (1.9 mL, 34.0 mmol) were added. Water was removed by azeotropic distillation with a Dean-Stark trap for 3 h. 1.8 mL water (93% of the theoretical amount) had separated at that time. The reaction mixture was cooled down, washed with saturated NaHCO$_3$ and water, dried over Na$_2$SO$_4$ in the presence of tert-butylcatechol, and concentrated. The product 8, a yellow residue, was dispersed in dry methanol (250 mL) and sodium borohydride (4.08 g, 108 mmol) was added portionwise under ice cooling. Stirring was continued for 10 min, then the colorless solution was poured into 1 M HCl (1000 mL). The precipitate was filtered off, dried under vacuum and recrystallized from tert-butyl methyl ether yielding 20.17 g (72%) of the product as a white powder with mp≈110° C. (decomp.)

$^1$H NMR (300 MHz, CDCl$_3$, δ(ppm, TMS)): 1.53, 1.74 (2 s, 6H, C(CH$_3$)$_2$); 3.48 (d, $^3$J=5.0 Hz, 2H, Ar—CH$_2$); 3.75 (t, $^3$J=5.0 Hz, 1H, CH(COO)$_2$); 5.22 (d, J=10.9 Hz, 1H, =CH$_{trans}$); 5.72 (d, $^3$J=17.7 Hz, 1H, =CH$_{cis}$); 6.68 (dd, $^3$J=10.9 Hz, $^3$J=17.7 Hz, 1H, =CH$_{gem}$); 7.28, 7.34 (2 d, $^3$J=8.2 Hz, 4H, CH$_{arom}$).

$^{13}$C NMR (75.5 MHz, CDCl$_3$, δ(ppm), APT): 27.1, 28.4 (C(CH$_3$)$_2$); 31.7 (Ar—CH$_2$); 48.0 (CH(COO)$_2$); 105.2 (C(CH$_3$)$_2$); 113.8 (=CH$_2$); 126.3, 129.9 (4 CH$_{arom}$); 136.3 (=CH); 136.5, 136.7 (C$_{arom}$); 165.2 (2 C=O).

FT-IR (KBr, cm$^{-1}$): 3000 w, 2905 w, 1785 m, 1750 s, 1630 w, 1360 m, 1330 s, 1275 m, 1205 m, 1050 m, 910 m.

CI-MS (CH$_4$, m/z): 261 (48, [M+H]$^+$), 235 (17), 203 (89, [M+H-acetone]$^+$), 117 (100, [C$_9$H$_9$]$^+$ Synthesis of Mono-tert-butyl 2-(4-vinylbenzyl)malonate 10

To a 100 mL flask fitted with a refluxing condenser and a drying tube containing CaCl$_2$ was added 2,2-dimethyl-5-(4-vinylbenzyl)-1,3-dioxane-4,6-dione 9 (13.00 g 49.9 mmol), 2-methyl-2-propanol (distilled over CaH$_2$, 47 g, 634 mmol) and 2,6-di-tert-butyl-4-methylphenol (0.55 g, 2.50 mmol; used as polymerization inhibitor). The mixture was stirred at 90° C. for 4 hours. This solution was concentrated in vacuo, and diluted with ethyl ether. The ether was extracted with dilute aqueous NaHCO$_3$. The aqueous phase was back washed with ethyl ether. The aqueous solution was acidified with diluted HCl giving a white solid. The solid was dissolved in ethyl ether. The ether was washed with water until neutral, dried over anhydrous MgSO$_4$, and concentrated in vacuo after removal of the drying agent to give a white solid (13.08 g, 95% yield).

$^1$H-NMR (CDCl$_3$, ppm): δ1.39 (s, 9H, C(CH$_3$)$_3$), 3.20 (d, 2H, J=7.8 Hz, CCH$_2$Ph), 3.61 (t, 1H, J=7.8 Hz, C(O)CH(CO)), 5.23 (d, 1H, J=10.8 Hz, CH=CH$_2$, cis), 5.74 (d, 1H, J=17.7 Hz, CH=CH$_2$, trans), 6.69 (q, 1H, J=10.8, 17.7 Hz, CH=CH$_2$), 7.19 (d, 2H, J=8.1 Hz, Ar—H), 7.34 (d, 2H, J=8.1 Hz, Ar—H). $^{13}$C-NMR (CDCl$_3$, ppm): δ27.8 (C(CH$_3$)$_3$), 34.5 (CCH$_2$Ph), 54.1 (C2), 82.7 (OC(CH$_3$)$_3$), 113.5 (CH=CH$_2$), 126.3, 129.0, 136.2, 137.1 (Ar), 136.4 (CH=CH$_2$), 167.9 (COO$^t$Bu), 174.5 (COOH) FT-IR: (KBr, cm$^{-1}$): ν3088 (w, Ar), 3004 (w), 2983(m, CH$_2$), 2670 (w, COOH), 1736 (s, C=O of ester), 1701 (s, C=O of acid), 1628 (w), 1514 (w), 1419 (w), 1370 (m), 1291 (m), 1257(m), 1146(s), 988(m), 842(w). MS (CI+) m/z=277 (23.7 [M+H]$^+$), 221 (100 [M+H—C$_4$H$_8$]$^+$). m.p.=67° C.

Synthesis of Poly(mono-tert-butyl 2-(4-vinylbenzyl)malonate) 5

Mono-tert-butyl-2-(4-vinylbenzyl)malonate 10 (10.03 g, 36.3 mmol) and AIBN (0.30 g, 1.81 mmol) were dissolved in 50mL of freshly distilled THF under N$_2$. A freeze-pump-thaw was performed three times, and nitrogen was back refilled. The solution was then heated with stirring at 60° C. overnight. The resulting mixture was cooled and the polymer was precipitated into 500 mL of hexanes with rapid stirring. The recovered polymer was dissolved in 50 mL of THF, and poured into a mixture of hexanes (250 mL) and ethyl ether (250 mL). The polymer was dried in vacuo at 50° C. giving 6.26 g of a white solid in 61% yield.

$^1$H-NMR (DMSO-d$_6$, ppm): 0.8~2.0 (bm, 12H, t-Bu, CH$_2$), 2.93 (bs, 2H, CCH$_2$Ph), 3.44 (bs, 1H, C(2)H), 6.36 (bs, 2H, Ar—H), 6.88 (bs, 2H, Ar—H). $^{13}$C-NMR (DMSO-d$_6$, ppm): 27.4 (C(CH$_3$)$_3$), 34.2 (CH$_2$), 54.0 (C2), 80.5 (OC(CH$_3$)$_3$), 128.4, 135.3, 145.0 (Ar), 167.9 (COO$^t$Bu), 170.1 (COOH)

FT-IR: (KBr, cm$^{-1}$): ν3208 (w, OH), 3009 (m, OH), 2979, 2927 (m, CH$_2$), 2616 (w, COOH), 1737 (s, C=O of ester), 1512 (w), 1447 (m), 1369 (m), 1250 (m), 1147 (s), 842 (m) GPC (polystyrene standard): Mn=9790, Mw=20800, PDI= 2.13

Example

Synthesis of poly(mono-isobornyl 2-(4-vinylbenzyl)malonate 14

Mono-isobornyl 2-(4-vinylbenzyl)malonate 13

To a 250 mL flask fitted with a reflux condenser and a drying tube containing CaCl$_2$ was added 2,2-dimethyl-5-(4-vinylbenzyl)-1,3-dioxane-4,6-dione 9(5.00g 19.2 mmol), isoborneol 12 (14.8 g, 96.1 mmol), 2,6-di-tert-butyl-4-methylphenol (0.22 g, 0.96 mmol) and freshly distilled THF (150 mL). This mixture was stirred at 90° C. overnight. This solution was diluted with ethyl ether. The ether was extracted with 0.5 N NaOH, and the aqueous phase was back washed with ethyl ether. The aqueous solution was then acidified with diluted HCl to give a white solid. The solid was dissolved in ethyl ether. The ether solution was washed with water until neutral, dried over MgSO$_4$, and concentrated in vacuo to give a slightly yellow white solid. This solid was recrystallized from hexanes giving a white solid, 5.18 g (76% yield).

$^1$H-NMR (CDCl$_3$, ppm): δ0.8~1.8 (m, 16H, isobornyl), 3.20 (d, 2H, J=7.8 Hz, CCH$_2$Ph), 3.65 (m, 1H, C(O)CH(CO)), 4.63 (m, 1H, OCH), 5.21 (d, 1H, J=10.5 Hz, CH=CH$_2$, cis), 5.72 (d, 1H, J=17.7 Hz, CH=CH$_2$, trans), 6.67 (q, 1H, J=10.8, 17.7 Hz, CH=CH$_2$), 7.15 (d, 2H, J=7.2 Hz, Ar—H), 7.31 (d, 2H, J=7.2 Hz, Ar—H). $^{13}$C-NMR (CDCl$_3$, ppm): δ11.2, 19.5, 20.0, 26.9, 33.5, 38.4, 44.9, 46.3, 48.9 (Isobornyl), 38.4 (CCH$_2$Ph), 53.7 (C2), 82.7 (OCH), 113.6 (CH=$\underline{C}$H$_2$), 126.3, 128.9,136.2, 137.1 (Ar), 136.4 ($\underline{C}$H=CH$_2$), 167.9 ($\underline{C}$OOIsobornyl), 174.5 ($\underline{C}$OOH)

FT-IR: (KBr, cm$^{-1}$): ν3090 (w, Ar), 3004 (w), 2955(m, CH$_2$), 2880 (w), 2737, 2640 (w, COOH), 1741 (s, C=O of ester), 1710 (s, C=O of acid), 1629 (w), 1514 (w), 1441 (w), 1321 (w), 1250(m), 1197(w), 1184(m), 1048 (w), 909 (w), 861 (w)

MS (CI+) m/z=submitted for analysis m.p.=83~85° C.

Poly(mono-isobornyl 2-(4-vinylbenzyl)malonate) 14

Mono-isobornyl 2-(4-vinylbenzyl)malonate 13 (1.50 g, 4.21 mmol) and AIBN (0.035 g, 0.21 mmol) were dissolved in 8 mL of freshly distilled THF under N$_2$. A freeze-pump-thaw was performed three times, and nitrogen was back refilled. The solution was then heated with stirring at 60° C. overnight. The resulting mixture was cooled and the polymer was precipitated into ice-cold hexanes (200 mL) with rapid stirring. The recovered polymer was dissolved in 5 mL of THF, and poured into ice-cold hexanes (200 mL). The polymer was dried in vacuo at 50° C. giving 0.46 g (31% yield) of a white solid.

$^1$H-NMR (DMSO-d$_6$, ppm): 0.4~1.8 (bm, 19H, Isobornyl, CH$\underline{C}$H$_2$), 3.00 (bs, 2H, C$\underline{C}$H$_2$Ph), 3.51 (bs, 1H, C(2)H), 4.45 (bs, OC$\underline{H}$), 6.0~7.2 (bd, 4H, Ar—H).

FT-IR: (KBr, cm$^{-1}$): ν3472, 3218 (w, OH), 2975 (s, CH$_2$), 2586 (w, COOH), 1733, 1715 (s, C=O), 1512 (w), 1454 (w), 1370 (w), 1243 (m), 1185 (s), 1050 (w), 822 (w)

Example
Poly(mono-tert-butyl-2-methyl-2-(4-vinylbenzyl)malonate 20
Synthesis of Mono-tert-Butyl-2-methylmalonate 16

2,2,5-Trimethyl-1,3-dioxane-4,6-dione 15 (15 g, 94.85 mmol) was placed in 100 ml flask. tert-Butanol (distilled over CaH$_2$, 30 g) was added to the flask, and the mixture was stirred at 75° C. for 24 hours under nitrogen atmosphere. The dione was first insoluble in the solvent, and gradually dissolved. The solution was then concentrated in vacuo, and poured into 50 ml of 2.5 wt % aqueous NaOH. The aqueous solution was washed with ethyl ether (50 ml, twice), and acidified with 10 wt % hydrochloric acid (pH~4). The solution became cloudy upon addition of the acid. The cloudy solution was extracted with ethyl ether (50 ml, twice). The extract was washed with deionized water until neutral, and dried over Na$_2$SO$_4$. The drying agent was removed by a gravitational filtration, and the filtrate was concentrated giving clear liquid (13.5 g, 82% yield).

$^1$H-NMR (CDCl$_3$, ppm): δ1.40 (d, 3H, J=7.5 Hz, C$\underline{H}_3$(C2)), 1.47 (s, 9H, t-Bu), 3.38 (q, J=7.5 Hz, H(C2))

$^{13}$C-NMR (CDCl$_3$, ppm): δ14 ($\underline{C}$H$_3$(C2)), 28 (C($\underline{C}$H$_3$)$_3$), 47 (C2), 82 ($\underline{C}$(CH$_3$)$_3$), 169 (COOR), 175 (COOH)

FT-IR: (NaCl, cm$^{-1}$): ν3517, 3223 (w, OH), 2978 (m, CH2), 1731 (s, C=O of ester), 1715 (C=O of acid), 1458 (m), 1366 (s), 1249 (m), 1150 (s, C(O)O), 1081 (m), 1024 (m), 834 (m)

MS (CI+) m/z=175 (23 [M+H]$^+$), 119 (100[M+H—C$_4$H$_8$]$^+$).

Synthesis of Benzyl-tert-butyl-2-methylmalonate 17

Mono-tert-butyl-2-methylmalonate (10.00 g, 57.43 mmol) was dissolved in 100 ml of THF (distilled over Na/K). DBU (9.62 g, 63.18 mmol) was added to the solution dropwise. Benzylbromide (10.81 g, 63.18 mmol) was then added to the mixture slowly. Upon addition of both DBU and benzylbromide, an exotherm was observed. The mixture was allowed to stir at room temperature overnight. The mixture was concentrated in vacuo. Water (50 ml) was added and the organic layer was extracted with ethylether (50 ml, twice). The combined organics were washed successively with 10 wt % aqueous HCl, 10 wt % aqueous NaHCO$_3$, and water, then dried over anhydrous Na$_2$SO$_4$. The drying agent was removed by a gravitational filtration, and the filtrate was concentrated giving slightly yellow liquid (10.81 g, 70 % yield).

$^1$H-NMR (CDCl$_3$, ppm): δ1.38 (m, 12H, t-Bu, C$\underline{H}_3$(C2)), 3.38 (q, J=7.2 Hz, H($\underline{C}$2)), 5.17 (d, 2H, J=3.9 Hz, OC$\underline{H}_2$Ph), 7.35 (m, 5H, Ar—H)

$^{13}$C-NMR (CDCl$_3$, ppm): δ13 ($\underline{C}$H$_3$(C2)), 28 (C($\underline{C}$H$_3$)$_4$), 47 (C2), 67 (O$\underline{C}$H$_2$Ph), 82 ($\underline{C}$(CH$_3$)$_4$), 128 (Ar), 136 (Ar), 169 ($\underline{C}$OO$^t$Bu), 170 ($\underline{C}$OOBz)

FT-IR: (NaCl, cm$^{-1}$): ν3072(w, Ar), 2980, 2942 (m, CH$_2$), 1750, 1730 (s, C=O of ester), 1457 (m), 1368 (m), 1329 (m), 1226 (m), 1144 (s, C(O)O), 1081 (m), 1026 (w), 848 (w)

MS (CI+) m/z=265 (77 [M+H]$^+$), 209 (100[M+H—C$_4$H$_8$]$^+$).

Benzyl-tert-butyl-2-methyl-2-(4-vinylbenzyl)malonate 18

Sodium hydride (60% in mineral oil, 0.98 g, 23.57 mmol) was placed in a 100 ml flask with a blanket of nitrogen. The sodium hydride was twice washed with cyclohexane. Dimethylformamide ("DMF"; 40 ml; distilled over MgSO$_4$) added to the flask giving a white cloudy mixture. The mixture was stirred at room temperature for 15 min. Benzyl-tert-butyl-2-methylmalonate 17 (5.00 g, 18.92 mmol) was slowly added and stirred for 15 min . . . Generation of gas was observed. Thereafter, 4-Vinylbenzylchloride (2.88 g, 18.920 mmol) was added slowly giving yellow color. The mixture was allowed to stir at room temperature for four days. The mixture was poured into 100 ml of water, and extracted with ethylether (100 ml, twice). The combined organics were washed with 2.5 wt % aqueous NaOH (30 ml), then washed with water until neutral, and then dried over anhydrous Na$_2$SO$_4$. The drying agent was removed by a gravitational filtration, and the filtrate was concentrated giving slightly yellow solid. The solid recrystallized from petroleum ether giving a white solid (5.73 g, 79.6% yield).

$^1$H-NMR (CDCl$_3$, ppm): δ1.31 (s, 3H, C$\underline{H}_3$(C2)), 1.33 (s, 9H, C(C$\underline{H}_3$)$_4$), 3.15 (q, 2H, CC$\underline{H}_2$Ph), 5.15 (s, 2H, OC $\underline{H}_2$Ph), 5.18 (d, 1H, J=10.8 Hz, CH=C$\underline{H}_2$, cis), 5.66 (d, 1H, J=17.4 Hz, CH=C$\underline{H}_2$, trans), 6.67 (q, 1H, J=10.8, 17.4 Hz, CH=CH$_2$), 7.03 (d, 2H, J=8.0 Hz, Ar—H), 7.24 (d, 2H, J=8.0 Hz, Ar—H), 7.35 (s, 5H, Ar—H)

$^{13}$C-NMR (CDCl$_3$, ppm): δ20 ($\underline{C}$H$_3$(C2)), 28 (C($\underline{C}$H$_3$)$_3$), 40 (C$\underline{C}$H$_2$Ph) 55 (C2), 67 (O$\underline{C}$H$_2$Ph), 82 ($\underline{C}$(CH$_3$)$_3$), 113 (CH=$\underline{C}$H$_2$), 126, 128, 130, (Ar), 135 ($\underline{C}$H=CH$_2$), 136 (Ar), 171, 172 ($\underline{C}$OO$^t$Bu, $\underline{C}$OOBz)

FT-IR: (NaCl, cm$^{-1}$): ν3062(w, Ar), 2978, 2929 (w, CH$_2$), 1725 (s, C=O of ester), 1455 (w), 1368 (w), 1278 (w), 1279 (w), 1178 (m, C(O)O), 1118 (m), 859 (w)

MS (CI+) m/z=381 (46 [M+H]$^+$), 325 (100 [M+H—C$_4$H$_8$]$^+$).

Synthesis of Poly(1benzyl-tert-butyl-2-methyl-2-(4-vinylbenzyl)malonate) 19

Benzyl-tert-butyl-2-methyl-2-(4-vinylbenzyl)malonate 18 (5.00 g, 13.14 mmol), and AIBN (0.108 g, 0.657 mmol) were dissolved in 25 mL of freshly distilled THF under N$_2$. Dry nitrogen was bubbled through the solution for five minutes. The solution was heated with stirring at 60° C. overnight. The resulting mixture was cooled and the polymer was precipitated into 500 mL of ice-cold methanol with rapid stirring. The obtained polymer was dissolved in 30 ml of THF, and poured into a mixture of water (150 ml)/methanol (350 ml). White chunk of polymer was obtained, and the polymer was dried in vacuo at room temperature overnight. The polymer (2.9 grams) was obtained in 59% yield.

$^1$H-NMR (ppm, Acetone-d$_6$): δ1.0~2.0 (bm, 15H, t-Bu, CH$_3$, CH$_2$), 3.2 (bs, 2H, CC$\underline{H}_2$Ph), 5.2 (bs, 2H, OC$\underline{H}_2$Ph), 6.5 (bs, 2H, Ar—H), 6.9 (bs, 2H, Ar—H), 7.3 (bd, 5H, OCH$_2$ $\underline{Ph}$).

$^{13}$C-NMR (ppm, Acetone-d$_6$): δ20 (CH$_3$(C2)), 28 (C(CH$_3$)$_3$), 41 (CCH$_2$Ph) 55 (C2), 67 (OCH$_2$Ph), 82 (C(CH$_3$)$_3$), 128, 129,130, 136 (Ar), 171, 172 (COO$^t$Bu, COOBz)

FT-IR (KBr): cm$^{-1}$: v3034(w, Ar), 2979, 2933 (w, CH$_2$), 1729 (s, C=O of ester), 1456 (m), 1369 (m), 1281 (m), 1252 (m), 1154 (m, C(O)O), 1110 (m), 847 (w)

GPC (polystyrene standard): Mn=12100, Mw=20600, PDI=1.70

Synthesis of 20 via 19

A mixture of poly(benzyl-tert-butyl-2-methyl-2-(4-vinylbenzyl)malonate 19 (0.66 g), ethyl acetate (5 ml) and palladium on activated carbon (Pd 10%, 0.0060 g, 1 wt % to the polymer) was placed in a high pressure reactor. Hydrogen was applied (90 psi) and the mixture was allowed to stir at room temperature for two weeks. The palladium catalyst was filtered off, and the filtrate was concentrated in vacuo giving polymer 20. $^1$H-NMR of the polymer showed that 89 mole percent of the benzyl group was cleaved.

$^1$H-NMR (ppm, Acetone-d$_6$): Decrease of the peaks of benzyl ester (7.3 ppm and 5.2 ppm)

An alternate route to polymer 20 is reported below.

Synthesis of tert-Butyl-phenyl-2-methylmalonate 21

Mono-tert-butyl-2-methylmalonate 16 (10.00 g, 57.43 mmol) was dissolved in 100 ml of dichloromethane (distilled over CaH$_2$) under a blanket of nitrogen. The solution was cooled with an ice bath. Thereafter, 1,3-dicyclohexylcarbodiimide (11.85 g, 57.43 mmol) was added to the solution slowly. A white solid, dicyclohexylurea, precipitated out. Upon addition of a catalytic amount of 4-dimethylaminopyridine (0.35 g, 2.87 mmol), the mixture turned slightly yellow indicating a formation of pyridinium salt. Phenol (5.95 g, 63.18 mmol) was then added to the mixture, and the yellowish color diminished in intensity. The mixture was allowed to stir at room temperature overnight. Three drops of acetic acid was added to the mixture, and stirred for 30 min. The white solid was filtered off, and the filtrate was concentrated in vacuo. 100 ml of ethyl acetate was added, and insoluble solids were filtered off. The solution of ethyl acetate was then washed with 5 wt % Na$_2$CO$_3$ aq., 5 wt % citric acid, and a brine, then dried over MgSO$_4$. After removal of the drying agent, the solution was concentrated giving slightly yellow liquid. Column chromatography (silica gel, eluent; hexanes/ethyl acetate=1/9 by volume) was performed to separate the product (Rf=0.77 on TLC with hexanes/ethyl acetate=8/2 by volume ). The product (12.16 g) was separated as a clear liquid in 85% yield.

$^1$H-NMR (CDCl$_3$, ppm): δ1.51 (d, 3H, J=7.5 Hz CH$_3$(C2)), 1.52 (s, 9H, tBu), 3.58 (q, J=7.5 Hz, H(C2)), 7.10 (d, 2H, J=7.5 Hz, Ar—H), 7.25 (t, 1H, J=7.5 Hz, Ar—H), 7.40 (t, 2H, J=7.5 Hz, Ar—H).

$^{13}$C-NMR (CDCl$_3$, ppm): δ13 (CH$_3$(C2)), 28 (C(CH$_3$)$_3$), 47 (C2), 82 (C(CH$_3$)$_3$), 121, 126, 129, 150 (Ar), 168, 168 (COO$^t$Bu, COOPh).

FT-IR: (NaCl, cm$^{-1}$): v3069(w, Ar), 2981, 2942 (m, CH$_2$), 1768, 1736 (s, C=O of ester), 1593 (m), 1493 (m), 1457 (m), 1393 (m), 1333 (m), 1197 (s), 1162 (s, C(O)O), 1073 (m), 1025 (w), 848 (w)

MS (CI+) m/z=251 (4 [M+H]$^+$), 195 (100[M+H—C$_4$H$_8$]$^+$).

Synthesis of tert-Butyl-phenyl-2-methyl-2-(4-vinylbenzyl) malonate 22

Sodium hydride (60% in mineral oil, 3.66 g, 87.89 mmol) was placed in a 250 ml flask with a blanket of nitrogen. The sodium hydride was twice washed with cyclohexane. DMF (90 ml; distilled over MgSO$_4$) was added to the flask giving a white cloudy mixture. The mixture was stirred at room temperature for 15 min. Thereafter, tert-Butyl-phenyl-2-methylmalonate 21 (11.00 g, 43.94 mmol) was slowly added and stirred for 15 min. Generation of gas was observed. Thereafter, 4-Vinylbenzylchloride 2 (6.71 g, 43.94 mmol) was added slowly resulting in a yellow reaction mixture. The mixture was allowed to stir at room temperature for four days. The mixture was poured into 200 ml of water, and extracted with ethylether (100 ml, twice). The combined organics were washed with water until neutral, and dried over anhydrous MgSO$_4$. The drying agent was removed by gravity filtration, and the filtrate was concentrated giving a yellow oil. Column chromatography (silica gel, eluent; hexanes/ethyl acetate=1/9 by volume) was performed to separate the product (Rf=0.78 on TLC with hexanes/ethyl acetate=8/2 by volume). Recrystallization from petroleum ether gave 4.05 g of white solid (25% yield).

$^1$H-NMR (CDCl$_3$, ppm): δ1.45 (s, 3H, CH$_3$(C2)), 1.51 (s, 9H, C(CH$_3$)$_3$), 3.26 (q, 2H, CCH$_2$Ph), 5.20 (d, 1H, J=10.8 Hz, CH=CH$_2$, cis), 5.69 (d, 1H, J=17.4 Hz, CH=CHhd 2, trans), 6.68 (q, 1H, J=10.8, 17.4 Hz, CH=CH$_2$), 7.05 (m, 2H, Ar—H), 7.21 (m, 3H, Ar—H), 7.36 (m, 4H, Ar—H).

$^{13}$C-NMR (CDCl$_3$, ppm): δ20 (CH$_3$(C2)), 28 (C(CH$_3$)$_3$), 41 (CCH$_2$Ph) 56 (C2), 82 (C(CH$_3$)$_3$), 113 (CH=CH$_2$), 121, 126, 128,129,130, 135, 136, 151 (Ar), 136 (CH=CH$_2$), 171 (COO$^t$Bu, COOBz.)

FT-IR: (NaCl, cm$^{-1}$): v3041(w, Ar), 2984, 2935 (w, CH$_2$), 1761, 1730 (s, C=O of ester), 1629 (w), 1592 (w), 1483 (w), 1368 (w), 1293 (w), 1224 (w), 1193 (s, C(O)O), 1152 (s), 1091 (s), 856 (m).

MS (CI+) m/z=367 (98 [M+H]$^+$), 311 (100 [M+H—C$_4$H$_8$]$^+$)

Melting point (m.p)=64~66° C.

Synthesis of Poly(tert-butyl-phenyl-2-methyl-2-(4-vinylbenzyl)malonate) 23

Phenyl-tert-butyl-2-methyl-2-(4-vinylbenzyl)malonate 22 (2.50 g, 6.82 mmol), and AIBN (0.056 g, 0.341 mmol) were dissolved in 25 ml of freshly distilled THF under N$_2$. Freeze-pump-thaw was performed three times, and back-refilled with nitrogen. The solution was then heated with stirring at 60° C. overnight. The resulting solution was concentrated to half its original volume, poured into 300 mL of methanol with rapid stirring to yield a white polymer. The polymer was dissolved in 10 ml of THF, and poured into 300 ml of methanol. White chunk of polymer was obtained, and the polymer was dried in vacuo at room temperature overnight. The polymer (1.17 grams) was obtained in 47% yield.

$^1$H-NMR (ppm, Acetone-d$_6$): δ1.0~2.0 (bm, 15H, t-Bu, CH$_3$, CH$_2$), 3.2 (bs, 2H, CCH$_2$Ph), 6.5 (bs, 2H, Ar—H), 6.7~7.5 (bm, 7H, Ar—H)

$^{13}$C-NMR (ppm, Acetone-d$_6$): δ21 (CH$_3$(C2)), 28 (C(CH$_3$)$_3$), 41 (CCH$_2$Ph) 56 (C2), 82 (C(CH$_3$)$_3$), 122, 127, 129, 130, 131, 134, 152 (Ar), 171 (COO$^t$Bu, COOBz)

FT-IR (KBr): cm$^{-1}$: v3044 (w, Ar), 2979, 2933 (m, CH$_2$), 1768, 1736 (s, C=O of ester), 1592 (w), 1493 (m), 1457 (m), 1369 (m), 1333 (m), 1277 (m), 1253 (m), 1253 (m) 1194 (s), 1161 (s, C(O)O), 1107 (m), 1082 (m), 847 (m)

GPC: Mn=18400, Mw=29800, PDI=1.62

Synthesis of Poly(mono-tert-butyl 2-methyl-2-(4-vinylbenzyl)malonate) 20: From hydrolysis of phenyl ester 23

Poly(tert-butyl phenyl 2-methyl-2-(4-vinylbenzyl) malonate) 23 (5.80 g, 15.83 mmol) was dissolved in 60 mL of THF. To this solution was added water (30 mL), potassium hydroxide (1.78 g, 31.7 mmol) and tetrabutylammonium bromide (1.02 g, 3.17 mmol). This mixture was vigorously stirred at 70° C. overnight. The mixture was initially cloudy, but turned into a clear two-phase mixture as the reaction proceeded. The resulting mixture was then poured into 800 mL of dilute HCl giving a white polymer. The polymer was collected by suction filtration, dissolved in THF, acidified with dilute HCl, and poured into 1 L of water. The polymer was dissolved in acetone, and precipitated by pouring into 1 L of water. The resulting polymer was dried under reduced pressure overnight to give a white powder, 4.24 g, in 92% recovery.

$^1$H-NMR (ppm, Acetone-$d_6$): 1.0~2.0 (bm, 15H, t-Bu, $CH_3$, $CH_2$), 3.1 (bs, 2H, CC$\underline{H}_2$Ph), 6.5 (bs, 2H, Ar—H), 6.9 (bs, 2H, Ar—H).

$^{13}$C-NMR (ppm, Acetone-$d_6$): 20.3 ($\underline{C}H_3$(C2)), 28.1 (C($\underline{C}H_3$)$_3$), 41.3 (C$\underline{C}H_2$Ph), 55.7 (C2), 81.6 (O$\underline{C}(CH_3)_3$), 128.2, 130.7, 134.6 (Ar), 171.5 ($\underline{C}OO^tBu$), 173.7 ($\underline{C}OOH$)

FT-IR: (KBr, cm$^{-1}$): ν3422, 3228 (w, OH), 3024 (m, $CH_{Ar}$), 2981, 2930 (m, $CH_2$), 2616 (w, OH), 1729 (s, C=O of ester), 1714 (C=O of acid), 1453 (m), 1369 (m), 1256 (m), 1155 (s), 1183 (m), 836 (w)

GPC (polystyrene standard, RI): Mn=7750, Mw=12600, PDI=1.63

Synthesis of Mono-tert-butyl 2-methyl-2-(4-vinylbenzyl) malonate 24

Tert-butyl-phenyl-2-methyl-2-(4-vinylbenzyl)malonate 22 (1.00 g, 2.73 mmol) was dissolved in 15 mL of ethanol. To this solution was added water (1.5 mL) and potassium hydroxide (0.31 g, 5.46 mmol). The resulting mixture was stirred at 75° C. for two days. The solution was concentrated with a rotary evaporator and then diluted with ethyl ether. The ether was extracted with saturated aqueous sodium bicarbonate, and washed with ethyl ether. The aqueous phase was back washed with ethyl ether, and then acidified with diluted HCl giving a white solid. The solid was dissolved in ethyl ether. The ether solution was washed with water until neutral, and then dried over anhydrous $MgSO_4$. The $MgSO_4$ was filtered off, and the filtrate was concentrated in vacuo giving white solid (0.66 g, 83% yield).

$^1$H-NMR (Acetone-$d_6$, ppm): δ1.26 (s, 3H, C$\underline{H}_3$(C2)), 1.44 (s, 9H, C(C$\underline{H}_3$)$_3$), 3.16 (s, 2H, CC$\underline{H}_2$Ph), 5.17 (d, 1H, J=10.8 Hz, CH=C$\underline{H}_2$, cis), 5.73 (d, 1H, J=17.7 Hz, CH=C$\underline{H}_2$, trans), 6.70 (q, 1H, J=10.8, 17.7 Hz, C$\underline{H}$=CH$_2$), 7.21 (d, 2H, J=8.1 Hz, Ar—H), 7.38 (d, 2H, J=8.1 Hz, Ar—H).

$^{13}$C-NMR (Acetone-$d_6$, ppm): δ20.0 ($\underline{C}H_3$(C2)), 27.9 (C($\underline{C}H_3$)$_3$), 41.2 (C$\underline{C}H_2$Ph) 55.6 (C2), 81.7 (O$\underline{C}(CH_3)_3$), 113.7 (CH=$\underline{C}H_2$), 126.6, 131.3, 136.8, 137.4 (Ar), 136.8 $\underline{C}H$=CH$_2$), 171.3 ($\underline{C}OO^tBu$), 173.2 ($\underline{C}OOH$)

FT-IR: (KBr, cm$^{-1}$): ν3239(w, OH), 2984, 2936 (w, $CH_2$), 1751 (s, C=O of ester), 1699 (s, C=O of acid), 1628 (w), 1511 (w), 1371 (w), 1288 (m), 1181 (m), 1128 (m), 834 (m).

MS (CI+) m/z=291 (17.7 [M+H]+), 235 (100 [M+H—$C_4H_8$]$^+$).

Melting point.=101–102° C.

Synthesis of Poly(mono-tert-butyl 2-methyl-2-(4-vinylbenzyl)malonate) 20: from monomer 24

Mono-tert-butyl 2-methyl-2-(4-vinylbenzyl)malonate 24 (0.62 g, 2.135 mmol) and AIBN (0.0179 g, 0.107 mmol) were dissolved in 5 mL of freshly distilled THF under $N_2$. A freeze-pump-thaw was performed three times, and nitrogen was back refilled. The solution was then heated with stirring at 60° C. overnight. The resulting mixture was cooled and the polymer was precipitated into 50 mL of hexanes with rapid stirring. A slightly yellow white solid was obtained (0.25 g, 40% yield)

$^1$H-NMR (ppm, Acetone-$d_6$): 1.0~2.0 (bm, 15H, t-Bu, $CH_3$, $CH_2$), 3.1 (bs, 2H, CC$\underline{H}_2$Ph), 6.5 (bs, 2H, Ar—H), 6.9 (bs, 2H, Ar—H).

FT-IR: (KBr, cm$^{-1}$): ν3211 (w, OH), 2980, 2934 (m, $CH_2$), 1728 (s, C=O of ester), 1717 (C=O of acid), 1512 (w), 1457 (m), 1369 (m), 1255 (m), 1155 (s), 1118 (m), 846 (w)

GPC: Mn=7030, Mw=11300, PDI=1.61

Example

Synthesis of poly (mono(4-vinylbenzyl)malonate-co-tert-butyl acrylate 28

Synthesis of Mono-4-vinylbenzyl malonate 26

A solution of malonic acid 25 (10.00 g, 96.1 mmol) and DBU (14.63 g, 96.1 mmol) in 100 ml of THF (distilled over Na/K alloy) was cooled with water bath. A solution of 4-Vinylbenzylchloride 2 (14.67 g, 96.1 mmol) in 50 ml of THF was added dropwise to the previous solution. The water bath was removed, and the mixture was stirred at room temperature overnight. The mixture showed two phases. The mixture was then concentrated in vacuo. The resulting oil was diluted with ethyl ether, and washed first with dilute aqueous HCl and then with deionized water until neutral. Aqueous $Na_2CO_3$ (10 wt %) was added, and the aqueous layer was washed with ethyl ether, acidified with dilute aqueous HCl and extracted with ethyl ether. The ether layer was dried over anhydrous $MgSO_4$. The $MgSO_4$ was filtered off, and the filtrate was concentrated in vacuo giving slightly yellow liquid (0.45 g, 2% yield).

$^1$H-NMR (CDCl$_3$, ppm): δ3.48 (s, 2H, H(C2)), 5.19 (s, 2H, benzyl), 5.26 (d, 1H, J=10.8 Hz, CH=C$\underline{H}_2$ cis), 5.74 (d, 1H, J=17.4 Hz, CH=C$\underline{H}_2$ trans), 6.70 (q, 1H, J=10.8, 17.4 Hz C$\underline{H}$=CH$_2$), 7.31 (d, 2H, J=8.1 Hz, Ar.), 7.40 (d, 2H, J=10.8 Hz, Ar.)

FT-IR: (NaCl, cm$^{-1}$): ν2400~3400 (bw, OH), 3003 (w, Ar.), 2902 (w, $CH_2$), 1743 (s, C=O of ester), 1702 (m, C=O of acid), 1624, 1512 (w, Ar), 1326 (m), 1201 (m, C(O)O of ester), 1153 (m), 987 (m)

MS (CI+) m/z=220 (9, [M+H]$^+$), 117 (100, [M+H—$C_3H_3O_4$]$^+$).

Synthesis of Poly(mono-4-vinylbenzyl malonate-co-tert-butyl acrylate) 28

Mono-4-vinylbenzyl malonate 26 (1.59 g, 7.216 mmol), tert-butyl acrylate 27 (1.07 g, 7.216 mmol) and AIBN (0.118 g, 0.719 mmol) were dissolved in 15 mL freshly distilled THF under $N_2$. Dry nitrogen was bubbled through the solution for five minutes. The solution was heated with stirring at 60° C. for 23 h. The resulting mixture was cooled and the polymer was precipitated into 150 mL of hexanes with rapid stirring. The obtained polymer was then dissolved in THF, and precipitated into 150 ml of ethyl ether. A lightly yellow colored solid (1.59 g) was obtained in 60% yield.

$^1$H-NMR (ppm, acetone-$d_6$): δ1.0~2.0 (bm), 3.5 (bs), 5.1 (bs), 6.8 (bs), 7.2 (bs)

FT-IR (KBr): cm$^{-1}$: ν3443 (w, OH), 2974, 2930 (m, $CH_2$), 2573 (w, OH), 1722 (s, C=O of ester), 1320 (m), 1146 (s, C(O)O), 982 (m)

The ratio of monomers incorporated into the polymer was determined by $^1$H-NMR calculating the ratio of the ratio of the aromatic protons and the methylene protons of the polymer backbone. Initial feed ratio: malonate/acrylate=50/50, Copolymer ratio calculated by NMR=61/39.

GPC: $M_N$=5420; PDI=1.94

UV-Vis: 0.15/um absorbance @ 248 nm (71% transmission)

Example

Synthesis of 4-Vinylphenylacetic acid 34

Magnesium turnings (2.63 g, 108 mmol) were placed in a three-neck round bottom flask fitted with a thermometer, an addition funnel and a reflux condenser with a nitrogen inlet. All of the glassware was dried under reduced pressure with a heat gun, and cooled to room temperature immediately before use. Ethyl ether (30mL, freshly distilled over Na) was added to the flask.

To the addition funnel was added 4-vinylbenzylchloride 2 (15.26 g, 160 mmol), and 50 mL of ethyl ether. About 5 mL of the chloride solution and a couple of pieces of iodine crystal were added to the flask. The mixture was stirred vigorously, and gently warmed with a water bath in order to initiate the reaction. Once the reaction started, the rest of the chloride solution was added dropwise under mild refluxing condition. The mixture was then allowed to stir for 2 h under refluxing after which the mixture turned slightly greenish, and some unreacted magnesium remained. The mixture was carefully added to a crushed dry ice (100 g). Vigorous bubbling was observed, and the solution turned chalky. After the bubbling was ceased, 10 wt % aqueous HCl was added until the solution was acidic. The mixture was stirred until two clear phases were obtained.

The organic phase was extracted with saturated aqueous sodium bicarbonate, and washed with ethyl ether. The aqueous phase was acidified with diluted HCl giving white solid. The solid was dissolved in ethyl ether. The ether solution was washed with water until neutral, and dried over anhydrous $MgSO_4$. The $MgSO_4$ was filtered off, and the filtrate was concentrated in vacuo giving white solid (8.14 g, 50% yield).

$^1$H-NMR ($CDCl_3$, ppm): δ3.62 (s, 2H, CC$\underline{H}_2$Ph), 5.21 (d, 1H, J=11.1 Hz, CH=C$\underline{H}_2$, cis), 5.70 (d, 1H, J=17.7 Hz, CH=C$\underline{H}_2$, trans), 6.68 (q, 1H, J=11.1, 17.7 Hz, C$\underline{H}$=CH$_2$), 7.24 (d, 2H, J=8.1 Hz, Ar—H), 7.38 (d, 2H, J=8.1 Hz, Ar—H). $^{13}$C-NMR ($CDCl_3$, ppm): δ40.7 (C$\underline{C}H_2$Ph) 114.0 (CH=$\underline{C}H_2$), 126.4, 129.5, 132.7, 136.3 (Ar), 136.7 ($\underline{C}$H=CH$_2$), 178.0 ($\underline{C}$OOH)

FT-IR: (KBr, cm$^{-1}$): ν3086(m, OH), 3047 (m, Ar), 2978 (m, CH$_2$), 1721, 1696 (s, C=O of acid), 1513 (w), 1421 (m), 1405 (m), 1343 (w), 1255 (m), 912 (m), 828 (m).

MS (CI+) m/z=163 (78 [M+H]$^+$), 117 (100 [M+H—CO—H$_2$O]$^+$). m.p.=90~91° C.

Synthesis of tert-Butyl 4-vinylphenylacetate 35

4-Vinylphenylacetic acid 34 (8.15 g, 50.3 mmol) was placed in a three-neck round bottom flask attached with a thermometer, and an addition funnel with a drying tube. Tetrahydrofuran (80 mL, distilled over Na/K alloy) was added to the reaction flask, and the solution was cooled with an ice bath. Trifluoroacetic anhydride (15 mL, 106.2 mmol) was slowly added using an addition funnel so that the reaction temperature was kept below 10° C. The solution was allowed to stir at 5° C. for 2 h. A solution of 2-Methylpropanol (freshly distilled over CaH$_2$, 36 mL, 376 mmol) in THF (50 mL) was added dropwise keeping the reaction temperature below 10° C. The solution was stirred for an additional 2 hours at 5° C., and then overnight at room temperature. Ethyl ether (200 mL) was added to the solution, and 170 mL of 1.25 N aqueous NaOH was slowly added while cooling with an ice bath. The solution was then allowed to stir at room temperature for 2 h. The organic layer was separated, washed with water until neutral, washed with brine, and then dried over anhydrous MgSO$_4$. The solvents were removed in vacuo, and 9.85 g of clear liquid was obtained in 90% yield.

$^1$H-NMR (CDCl$_3$, ppm): δ1.40 (s, 9H, C(C$\underline{H}_3$)$_3$), 3.46 (s, 2H, CC$\underline{H}_2$Ph), 5.18 (d, 1H, J=10.8 Hz, CH=C$\underline{H}_2$, cis), 5.70 (d, 1H, J=17.4 Hz, CH=C$\underline{H}_2$, trans), 6.63 (q, 1H, J=10.8, 17.4 Hz, C$\underline{H}$=CH$_2$), 7.20 (d, 2H, J=8.1 Hz, Ar—H), 7.32 (d, 2H, J=8.1 Hz, Ar—H). $^{13}$C-NMR (CDCl$_3$, ppm): δ27.7 C(CH$_3$)$_3$42.0 (C$\underline{C}H_2$Ph), 80.3 (O$\underline{C}$(CH$_3$)$_3$), 113.2 (CH=$\underline{C}H_2$), 126.0, 129.0, 134.0, 135.9 (Ar), 136.2 $\underline{C}$H=CH$_2$), 170.3 ($\underline{C}$OOR).

Example

Synthesis of Poly(mono-4-vinylbenzyl malonate-co-4-hydroxystyrene-co-tert-butyl 4-vinylphenylactate) 37
Synthesis of Poly(mono-4-vinylbenzyl malonate-co-4-acetoxystyrene-co-tert-butyl 4-vinylphenylactate) 36

A solution of mono-4-vinylbenzyl malonate 26 (1.30 g, 5.90 mmol), 4-acetoxystyrene, 31 (0.96 g, 5.90 mmol), tert-butyl 4-vinylphenylacetate 35 (1.72 g, 7.87 mmol) and AIBN (0.16 g, 0.984 mmol) in 20 mL of THF was degassed by freeze-pump-thaw (three times), back refilled with nitrogen, and heated with stirring at 60° C. overnight. The resulting mixture was cooled and poured into 200 mL of hexanes with rapid stirring. The recovered polymer was redissolved in 20 mL of THF, and poured into 200 mL of hexanes. White polymer (2.40 g) was obtained in 60% yield. The ratio of monomers incorporated into the polymer was determined by $^1$H-NMR by calculating the ratio of the aromatic protons, methyl protons of the acetyl group (2.2 ppm), the benzyl protons of malonate (5.1 ppm), and two a-protons of the malonate and benzyl protons of vinylphenylacetate (3.5 ppm). Initial feed ratio: acid/acetoxy/tert-butyl=30/30/40, Terpolymer ratio calculated by NMR=36/33/31.

$^1$H-NMR (ppm, Acetone-d$_6$): δ1.3~2.0 (b, —CHCH$_2$—), 1.4 (bs, C(C$\underline{H}_3$)$_3$), 2.2 (bs, O(C=O)C$\underline{H}_3$), 3.5 (bs, CC$\underline{H}_2$Ph and O(C=O)C$\underline{H}_2$(C=O)O), 4.6 (HOC$\underline{H}_2$Ph), 5.1 (bs, (C=O)OC$\underline{H}_2$Ph), 6.4~7.3 (bm, Ar—H).

$^{13}$C-NMR (ppm, Acetone-d$_6$): 21.1 (PhO(C=O)$\underline{C}$H$_3$), 28.3 (C($\underline{C}H_3$)$_3$), 41.0 (O(C=O)$\underline{C}H_2$(C=O)O), 42.5 (Bz $\underline{C}$OOR), 67.2 (Ph$\underline{C}H_2$O(C=O)), 82.4 ($\underline{C}$(CH$_3$)$_3$), 122.1, 128.7, 129.8, 133.3, 149.9 (Ar), 167.4, 168.0 (RO($\underline{C}$=O)CH$_2$$\underline{C}$OOH), 169.6 (PhO($\underline{C}$=O)CH$_3$), 171.3 ($\underline{C}$OO$^t$Bu).

FT-IR: (KBr, cm$^{-1}$): ν3436 (w, OH), 2978, 2926 (m, CH$_2$), 1734 (s, C=O of esters, acids), 1506 (m), 1369 (m), 1217 (s), 1200 (s), 1165 (s), 1144 (s), 1017 (w), 838 (w), 821 (w).

GPC(refractive index detector): Mw=11900, Mn=7580
Synthesis of Poly(mono-4-vinylbenzyl malonate-co-4-hydroxystyrene-co-tert-butyl 4-vinylphenylactate) 37

Poly(mono-4-vinylbenzyl malonate-co-4-acetoxystyrene-co-tert-butyl 4-vinylphenylactate) 36 (1.70 g) was dissolved in 11 grams of methanol. Ammonium hydroxide (30 wt %, 3 g) was added to the solution. The solution was allowed to stir at room temperature overnight. The solution was poured into 100mL of 1 wt % HCl giving white solid. The solid was dissolved in THF, acidified with diluted HCl, poured into 100 mL of water. The recovered polymer was again dissolved in THF, and poured into 100 mL of water. The obtained polymer was dried under reduced pressure (1.36 g). $^1$H and $^{13}$C-NMR of the polymer indicate that the mono ester of malonate monomer was partially hydrolyzed and decarboxylated.

$^1$H-NMR (ppm, Acetone-d$_6$): δ1.0~2.0 (b, —CHCH$_2$—), 1.4 (bs, C(C$\underline{H}_3$)$_3$), 3.5 (bs, CC$\underline{H}_2$PH and O(C=O)$\underline{H}_2$(C=O)O), 4.6 (HOC$\underline{H}_2$Ph), 5.1 (bs, (C=O)OC$\underline{H}_2$Ph), 6.3~7.4 (bm, Ar—H).

$^{13}$C-NMR (ppm, Acetone-d$_6$): δ28.3 (C(CH$_3$)$_3$),40.8 (O(C=O)$\underline{C}H_2$(C=O)O), 42.5 (Ph$\underline{C}H_2$COOR), 64.5 (HO$\underline{C}H_2$Ph), 67.2 ((C=O)O$\underline{C}H_2$Ph), 80.6 (O$\underline{C}$(CH$_3$)$_3$), 115.6 (?), 127~129, 133, 134, 155.9 (Ar), 167.4, 168.1 (RO($\underline{C}$=O)CH$_2$$\underline{C}$OOH), 171.4 ($\underline{C}$OO$^t$Bu).

FT-IR: (KBr, cm$^{-1}$): ν3433 (m, OH), 3024 (m), 2977, 2924 (m, CH$_2$), 1733 (s, C=O of esters, acids), 1513 (s), 1452 (m), 1369 (s), 1257 (m), 1144 (s), 1019 (w), 959 (w), 832 (m).

Example
Thermal Gravimetric Analysis of Polymers 5, 14. and 20

Figure 2:
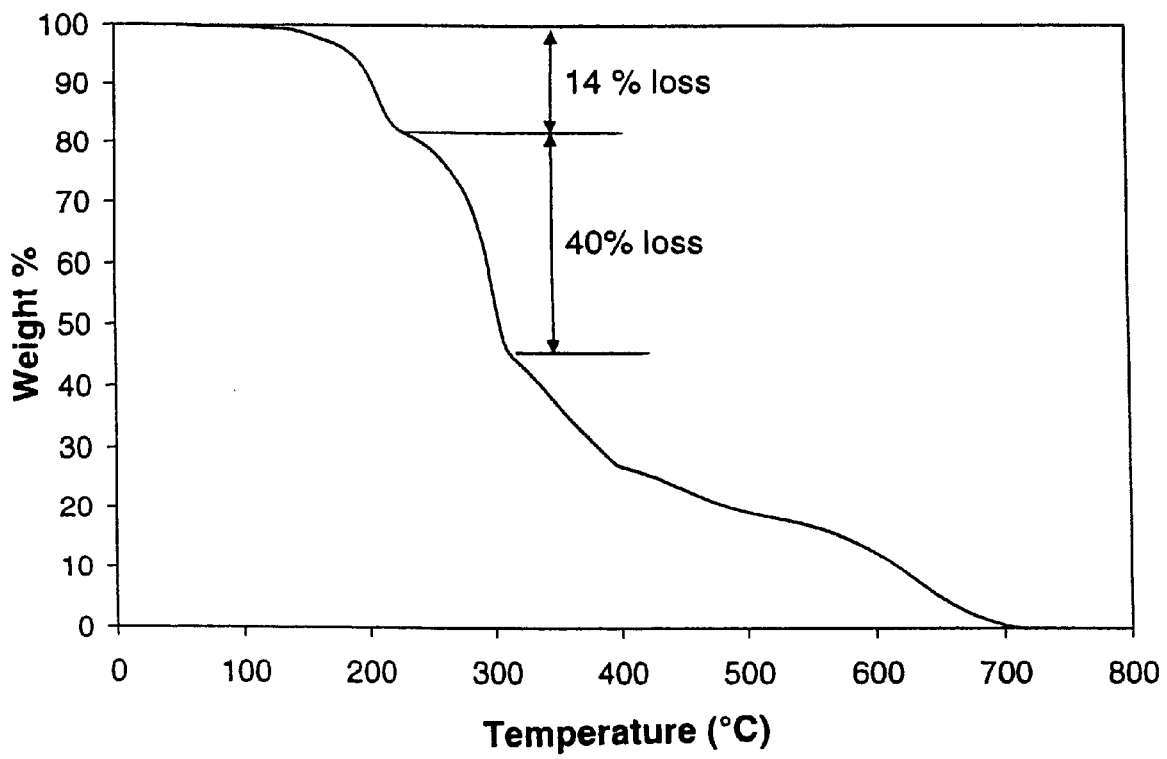
FIG. 2 shows the TGA of polymer 14.

Thermal Gravimetric analysis (TGA) were performed on samples of poly(mono-tert-butyl 2-(4-vinylbenzyl) malonate) 5, Poly(mono-tert-butyl 2-methyl-2-(4-vinylbenzyl) malonate) 20, and poly(mono-isobornyl 2-(4-vinylbenzyl)malonate 14 using a Perkin-Elmer TGA 7 Analyzer. Studies were conducted at a heating rate of 10° C./minute from 50–400° C. and 50° C./minute from 400–800° C. FIG. 1 shows TGA of polymers 5 and 20. Weight loss starts around 130° C., and the first loss represents approximately 35% of the mass of the samples. The theoretical weight loss for decarboxylation of polymers 5 and 20 is 15.9% and 15.2%, respectively. FIG. 2 shows TGA of poly(mono-isobornyl 2-(4-vinylbenzyl)malonate 14 obtained with the same heating profile as for polymers 5 and 20. Poly(mono-isobornyl 2-(4-vinylbenzyl)malonate 14 displays a distinct 14% weight loss starting around 130° C., followed the a subsequent loss of 40%. The weight loss calculated for decarboxylation of Polymer 14 is 12%, and the loss calculated for cleavage and volatilization of the isobornyl protecting group is 39%.

Example
Photoresist Composition and Lithographic Evaluation of Poly(mono-tert-butyl 2-methyl-2-(4-vinylbenzyl)malonate) 20

A photoresist composition was formulated with poly(mono-tert-butyl 2-methyl-2-(4-vinylbenzyl)malonate) 20 (0.2 grams) water (1.7 grams), ammonium hydroxide (0.1 gram) and a water soluble photoacid generator (PAG), 4-methoxyphenyldimethylsulfonium triflate (0.02 grams, 10 wt % relative to polymer). A clear aqueous solution was obtained after two to three hours agitation.

Figure 3:
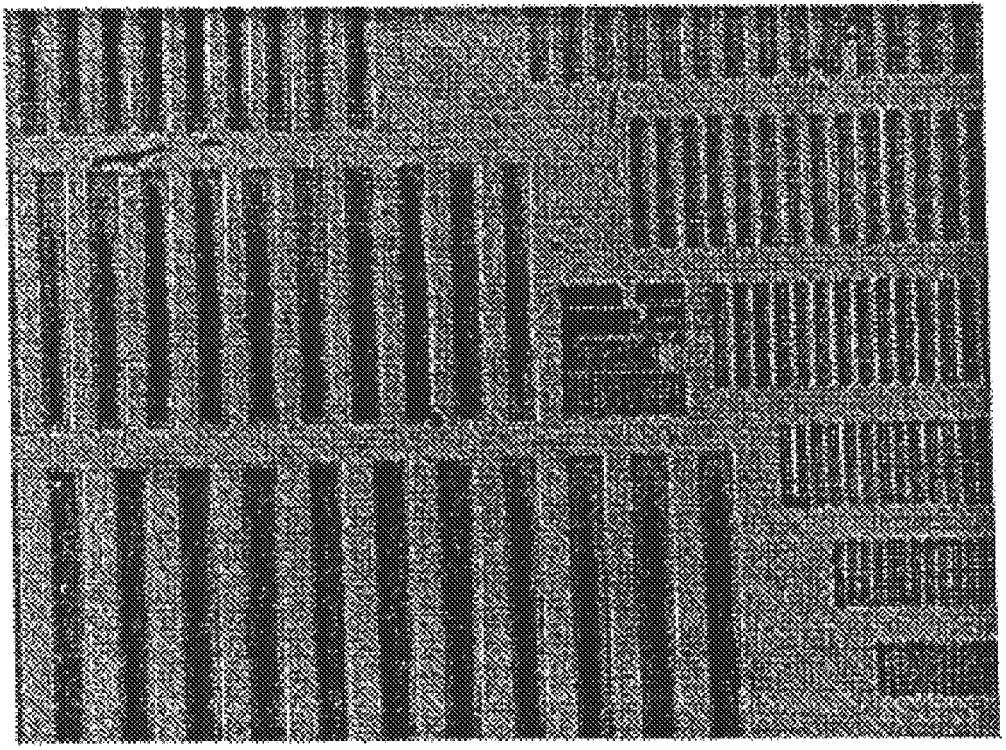
FIG. 3 is an optical micrograph (×75) demonstrating positive-tone images produced with a photoresist composition of polymer 20.

Lithographic evaluation was carried out using a Headway spin-coater, JBA LS65 1 KW exposure system with a 248 nm bandpass filter from Acton Research, and an Optoline quartz mask for contact printing. The photoresist film was coated on a silicon wafer and baked at several different temperatures. Preactivation baking (PAB) conditions were varied from 110–170° C. for 5 minutes. After exposure to 248 nm light (15 mJ/cm$^2$), the films were baked at 120° C. for 1 min and developed with MF CD-26® (TMAH 2.38%) diluted to 1:50 with water produced positive tone images, as shown in FIG. 3.

Example
Photoresist Composition and Lithographic Evaluation of Poly(mono-isobornyl 2-(4-vinylbenzyl)malonate 14

A photoresist composition was formulated with poly (mono-isobornyl 2-(4-vinylbenzyl)malonate 14, water, ammonium hydroxide and a water soluble photoacid generator (PAG), triphenylsulfonium nonaflate (1.5 wt % relative to polymer).

Figure 4:
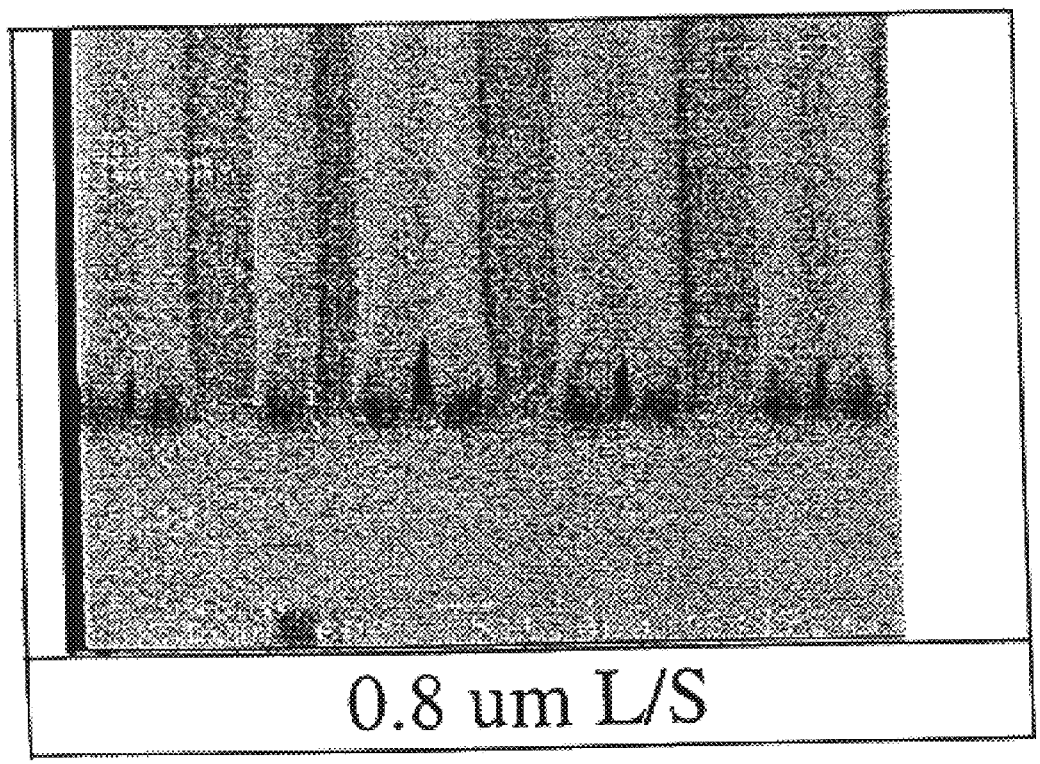
FIG. 4 is a Scanning Electron Micrograph (SEM) demonstrating positive tone images produced with a photoresist composition of polymer 14 (0.8 μm L/S).
Figure 5:
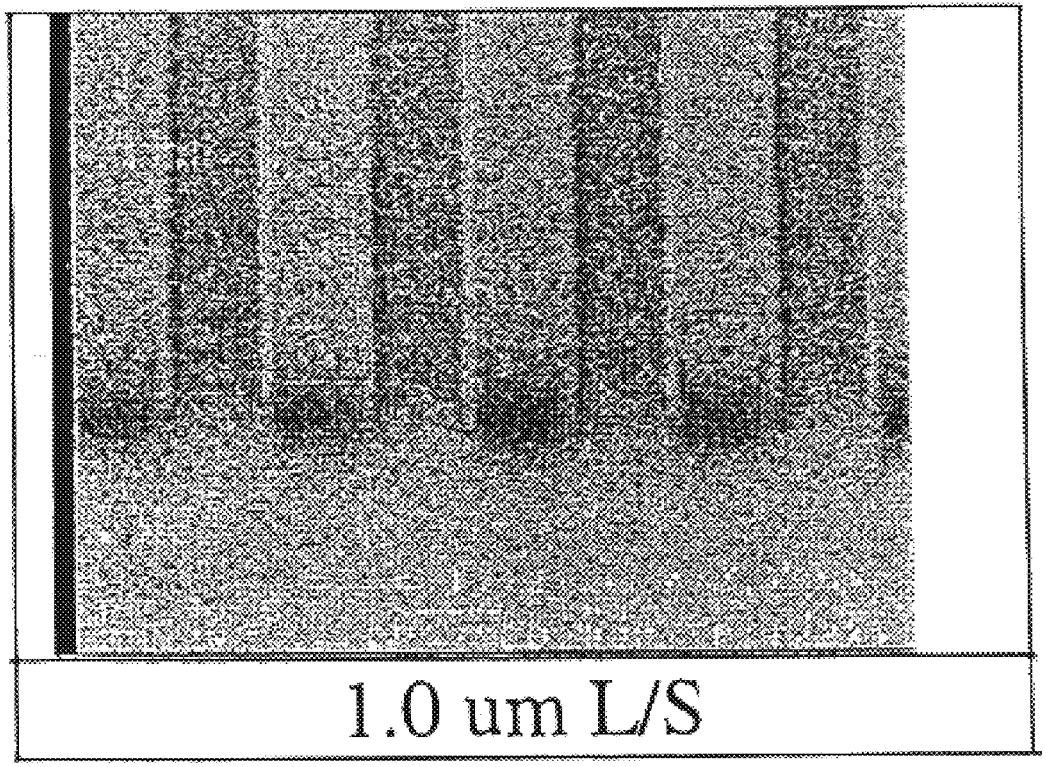
FIG. 5 is a SEM demonstrating positive tone images produced with a photoresist composition of polymer 14 (1.0 μm L/S).
Figure 6:
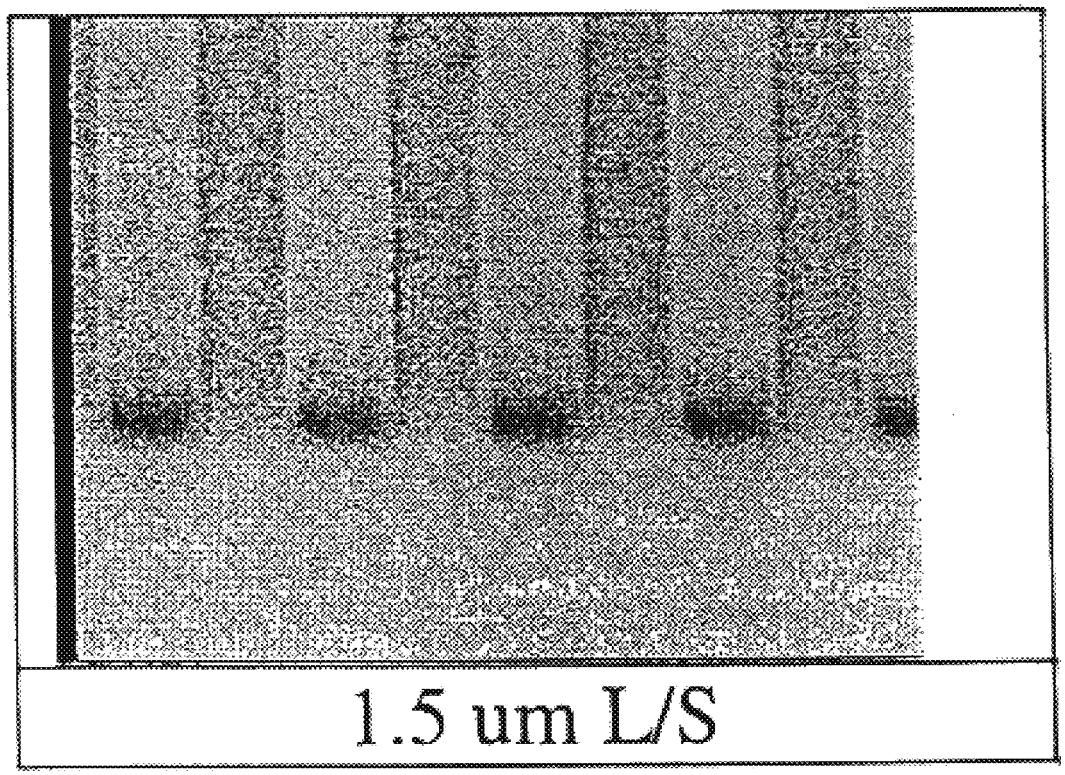
FIG. 6 is SEM demonstrating positive tone images produced with a photoresist composition of polymer 14 (1.5 μm L/S).

Lithographic evaluation was carried out using a Headway spin-coater, JBA LS65 1 KW exposure system with a 248 nm bandpass filter from Acton Research, and an Optoline quartz mask for contact printing. Silicon wafers were primed with DUV-30 ® anti-reflective coating (608 nm thickness) and then coated with the photoresist composition. Preactivation baking (PAB) conditions were 165° C. for 5 minutes, producing a film of 0.4 µm thickness. After exposure to 248 nm light (20 mJ/cm$^2$), the film was baked at 140° C. for 1 min and developed with undiluted MF CD-26® (TMAH 2.38%) for 30 seconds. FIGS. 4–6 are SEM pictures (1 µm resolution) demonstrating positive tone images produced with the polymer 14 composition.

Example
Etch Rate Study of Photoresist Composition Containing Poly(mono-isobornyl 2-(4-vinylbenzyl)malonate 14

Etch rates were measured on a LAM 9400 PTX tool operating a 450 W/45W with a pressure of 20 mTorr and employing 200 sccm HBr, 75 sccm $Cl_2$, and 10 sccm He—$O_2$. The etch rate of a film of photoresist containing polymer 14 was compared to that of commercially available resists, APEX-E ® and SPR-510L®. The results are as follows:

|  | Polymer 14 composition | APEX-E ® | SPR-510L ® |
| --- | --- | --- | --- |
| Etch Rate (A/min) | 758 | 698 | 443 |
| Relative rate | 1.09 | 1.00 | 0.63 |

Example
Photoresist Composition and Lithographic Evaluation of Ammonium salt of Poly(mono-4-vinylbenzyl malonate-co-tert-butyl acrylate) 28

Figure 7:
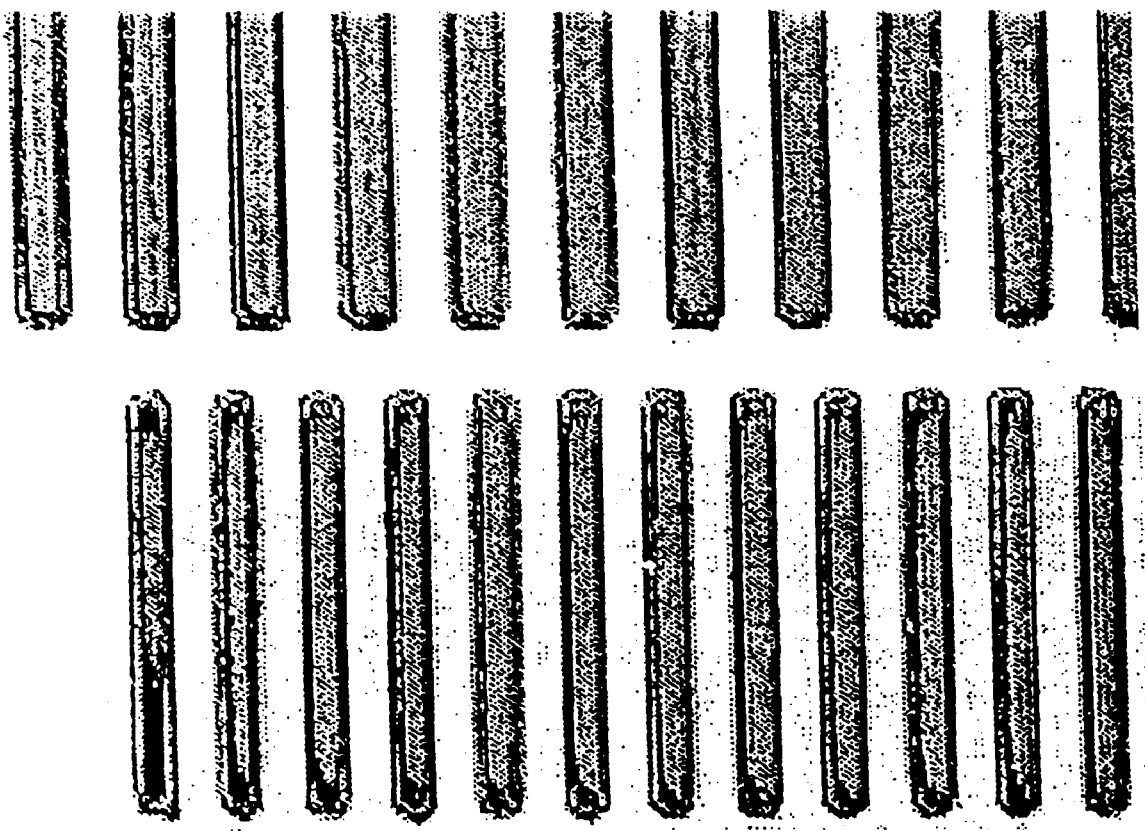
FIGS. 7 and 8 are optical micrographs (×75) demonstrating positive tone images produced with a photoresist composition of polymer 28.
Figure 8:
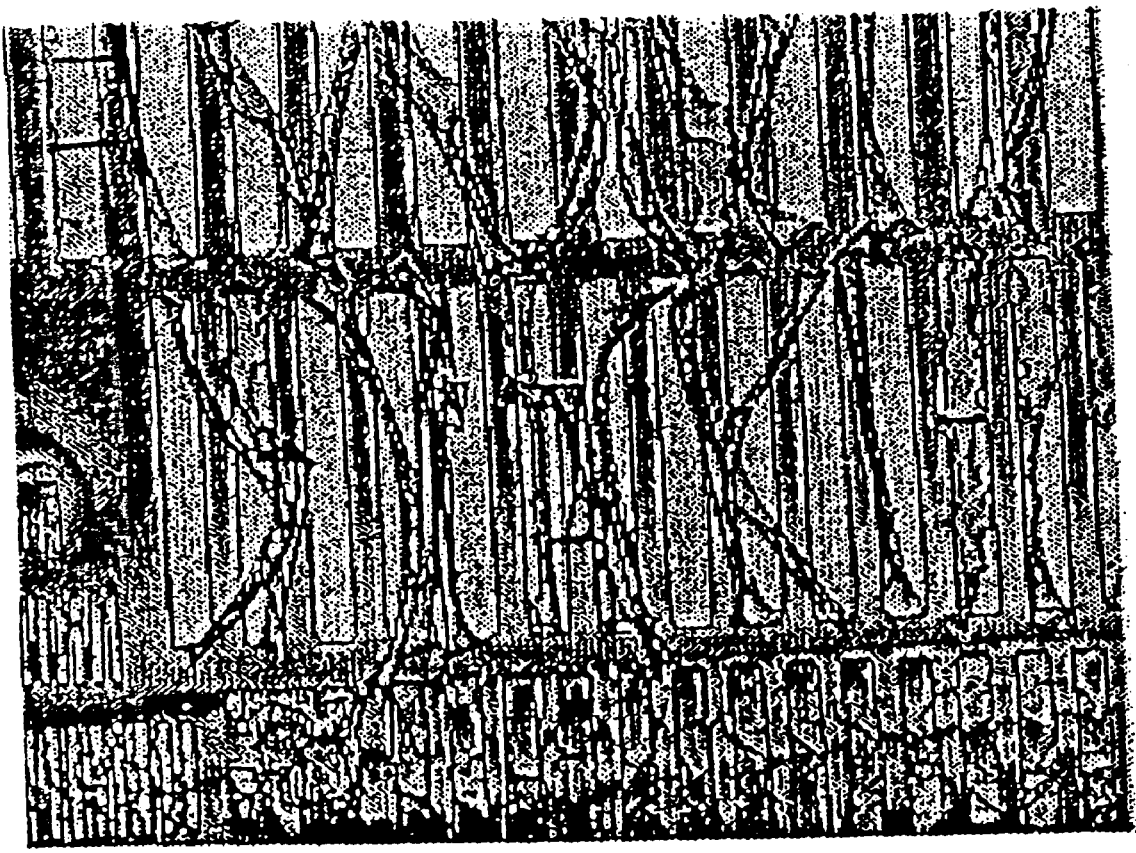

A composition of copolymer 29, the ammonium salt of poly(mono-4-vinylbenzyl malonate-co-tert-butyl acrylate) 28 (x:y=6:4) (0.5 grams), 4-methoxyphenyldimethylsulfonium triflate (0.05 grams, 10 wt % relative to polymer) and 2.0 grams of water, was prepared and coated on silicon wafers. Pre-Activation Baking (PAB) conditions were 110° C. for 5 minutes, producing a film of 0.6 µm thickness. Activating radiation was DUV (248 nm) at 100 mJ/cm$^2$. Post-exposure Baking (PEB) of 130° C. for 2 minutes and TMAH development (2,38 wt %, 30 sec), produced the positive tone images viewed by optical microscopy (×75) as FIGS. 7 and 8.

Each of the patent and/or scientific documents referred to above is incorporated herein in its entirely and for all purposes by reference. Also incorporated by reference herein and made a part of this Application are: S. Yamada, et al. "The design and study of aqueous-processable positive tone photoresists", Advances in Resist Technology and Processing XVII, Francis M. Houlihan, Editor, Proceedings of SPIE, Vol. 3999 (Feb. 28–Mar. 1, 2000), and S. Yamada, et al. "Design and study of water-processable positive-tone photoresists", Abstracts of Papers of the American Chemical Society, 1999 V218, 2 (Aug. 22, 1999 New Orleans, La.) P201-PMSE and Volume 81, pages 87–88.

Except in the Examples, or where otherwise explicitly indicated, all numerical quantities in this description specifying amounts of materials, concentrations, number of amino acids in a peptide, and the like, are to be understood as modified by the word "about".

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A water-processable positive-tone photoresist, comprising a water-processable photoacid generator, water or an aqueous base, and a water-soluble polymer, wherein said polymer contains a heat-labile functional group that renders said polymer insoluble in water or aqueous base upon heat treatment, and an acid-labile functional group that restores said water or aqueous base solubility to the polymer upon photochemical generation of the acid.

2. The composition of claim 1 wherein said heat-labile group is a carboxylic acid or salt, wherein said polymer undergoes decarboxylation upon heating, said polymer being soluble in water or aqueous base prior to decarboxylation but insoluble in water or said aqueous base upon decarboxylation.

3. The composition of claim 2 wherein the carboxylic acid salt is an ammonium or a low molecular weight alkylammonium salt.

4. The composition of claim 2 wherein the carboxylic acid or salt comprises an alpha cyano, an alpha carboxy, or a beta carbonyl group.

5. The composition of claim 2 wherein the carboxylic acid or salt comprises a substituted malonic acid or salt.

6. The composition of claim 2 wherein the polymer undergoes decarboxylation at a temperature from about 60° C. to about 190° C.

7. The composition of claim 1 wherein said acid-labile group is a carboxylic acid ester, wherein said ester undergoes cleavage under acid conditions, said polymer being insoluble in water or aqueous base prior to ester cleavage but soluble in water or said aqueous base after ester cleavage.

8. The composition of claim 7 wherein the carboxylic acid ester is a tert-butyl ester of a carboxylic acid.

9. The composition of claim 7 wherein the carboxylic acid ester is an isobornyl ester of a carboxylic acid.

10. The composition of claim 1 wherein the polymer is a styrene or an acrylate.

11. The composition of claim 1 wherein the polymer is a copolymer.

12. The composition of claim 11 wherein the copolymer is an acrylate copolymer.

13. The composition of claim 1 wherein the photoacid generator is about 0.5% to about 15% by weight of the polymer.

14. The composition of claim 13 wherein the photoacid generator is selected from the group consisting of an aryl diazonium salt, an aryl sulfonium salt, an aryl iodonium salt, and an imidosulfonate.

15. The composition of claim 1 further comprises a sensitizer.

16. A water-processable positive-tone photoresist composition comprising:
(a) a polymer comprising at least one salt of a carboxylic acid and at least one acid labile group and wherein said polymer undergoes decarboxylation upon heat treatment and wherein said polymer undergoes cleavage upon acid treatment;
(b) a water-soluble photoacid generator; and
(c) water or an aqueous base; the composition being characterized in that a dry film of the composition can be prepared; wherein the film is soluble in water or an aqueous base prior to the heat treatment, and insoluble in water or aqueous base after the heat treatment of said polymer; and wherein exposure of said film to irradiation renders said film soluble in water or said aqueous base.

17. A method for producing a positive-tone photoresist comprising the steps of:
(a) applying to a substrate a solution comprising a water-soluble polymer capable of being converted to a water-insoluble form of the polymer upon heating and capable of being restored to a water-soluble form of the polymer upon irradiation, wherein the polymer contains a heat-labile functional group and an acid-labile functional group; a water-processable photoacid generator; and water or an aqueous base; to produce a coated substrate;
(b) heating the coated substrate to remove the water from said substrate to form a film on the substrate, and to convert the water-soluble polymer to a water-insoluble form of polymer;
(c) selectively exposing said film to irradiation to generate acid from the water-processable photoacid generator, such that the generated acid restores the water-insoluble polymer to a water-soluble form of the polymer; and
(d) developing the exposed film with an aqueous developer to produce the positive-tone photoresist.

18. The method of claim 17 wherein the substrate selected from the group consisting of a ceramic material, a silicon wafer, a lithography plate, a magnetic disc, a printed circuit board, and a substrate for flex circuitry.

19. The method of claim 17 wherein the solution is applied by dipping, spin coating, roll coating, screen printing, or applicator coating.

20. The method of claim 17 wherein the water-soluble polymer and the water-processable photoacid generator are applied to the substrate in sequential operations in either order.

21. The method of claim 17 wherein said heat-labile group is a carboxylic acid or salt, wherein said polymer undergoes decarboxylation upon heating.

22. The method of claim 21 wherein the carboxylic acid salt is an ammonium or a low molecular weight alkylammonium salt.

23. The method of claim 21 wherein the carboxylic acid or salt comprises an alpha cyano, an alpha carboxy, or a beta carbonyl group.

24. The method of claim 21 wherein the carboxylic acid or salt comprises a substituted malonic acid or salt.

25. The method of claim 17 wherein the coated substrate is heated at a temperature from about 60° C. to about 190° C.

26. The method of claim 17 wherein the acid-labile group is a carboxylic acid ester, wherein said ester undergoes cleavage under acid conditions.

27. The method of claim 26 wherein the carboxylic acid ester is a tert-butyl ester of a carboxylic acid.

28. The method of claim 26 wherein the carboxylic acid ester is an isobornyl ester of a carboxylic acid.

29. The method of claim 17 wherein the wavelength of the radiation is from about 157 nm to about 365 nm.

30. The method of claim 17 wherein the radiation is selected from the group consisting of X-rays, extreme ultraviolet radiation, and ion-beam radiation.

31. The method of claim 17 wherein the aqueous developer is water or an aqueous base.

32. A water-processable positive-tone photoresist composition made by the process comprising the steps of:
(a) applying to a substrate a solution comprising a water-soluble polymer capable of being converted to a water-insoluble form of the polymer upon heating and capable of being restored to a water-soluble form of the polymer upon irradiation, wherein the polymer contains a heat-labile functional group and an acid-labile functional group; a water-processable photoacid generator; and water or an aqueous base; to produce a coated substrate;

(b) heating the coated substrate to remove the water from said substrate to form a film on the substrate, and to convert the water-soluble polymer to a water-insoluble form of polymer;

(c) selectively exposing said film to irradiation to generate acid from the water-processable photoacid generator, such that the generated acid restores the water-insoluble polymer to a water-soluble form of the polymer; and (d) developing the exposed film with an aqueous developer to produce the positive-tone photoresist.

* * * * *